United States Patent
Engelmann et al.

(10) Patent No.: US 7,436,038 B2
(45) Date of Patent: *Oct. 14, 2008

(54) VISIBLE/NEAR INFRARED IMAGE SENSOR ARRAY

(75) Inventors: Michael G. Engelmann, Pukalani, HI (US); Calvin Chao, Cupertino, CA (US); Tzu-Chiang Hsieh, Fremont, CA (US); Peter Martin, Kahului, HI (US); Milam Pender, Kihei, HI (US)

(73) Assignee: e-Phocus, Inc, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/785,833

(22) Filed: Feb. 23, 2004

(65) Prior Publication Data

US 2005/0104089 A1     May 19, 2005

Related U.S. Application Data

(63) Continuation-in-part of application No. 10/746,529, filed on Dec. 23, 2003, and a continuation-in-part of application No. 10/648,129, filed on Aug. 26, 2003, now Pat. No. 6,809,358, and a continuation-in-part of application No. 10/371,618, filed on Feb. 22, 2003, now Pat. No. 6,730,900, and a continuation-in-part of application No. 10/229,953, filed on Aug. 27, 2002, and a continuation-in-part of application No. 10/229,954, filed on Aug. 27, 2002, now Pat. No. 6,791,130, and a continuation-in-part of application No. 10/229,955, filed on Aug. 27, 2002, now Pat. No. 7,411,233, and a continuation-in-part of application No. 10/229,956, filed on Aug. 27, 2002, now Pat. No. 6,798,033, and a continuation-in-part of application No. 10/072,637, filed on Feb. 5, 2002, now Pat. No. 6,730,914.

(51) Int. Cl.
*H01L 31/00* (2006.01)

(52) U.S. Cl. .................. 257/444; 257/291; 257/292; 257/461; 257/462; 257/233; 257/258; 257/E27.133

(58) Field of Classification Search .................. 257/118, 257/222, 229, 233, 234, 257, 258, 290, 291, 257/292, 461, 462, 444, E27.133
See application file for complete search history.

(56) References Cited

U.S. PATENT DOCUMENTS 4,759,947 A * 7/1988 Ishihara et al. .............. 427/568

(Continued)

*Primary Examiner*—Evan Pert
*Assistant Examiner*—Tan N Tran
(74) *Attorney, Agent, or Firm*—John R. Ross

(57) ABSTRACT

A MOS or CMOS sensor for high performance imaging in broad spectral ranges including portions of the infrared spectral band. These broad spectral ranges may also include portions or all of the visible spectrum, therefore the sensor has both daylight and night vision capabilities. The sensor includes a continuous multi-layer photodiode structure on a many pixel MOS or CMOS readout array where the photodiode structure is chosen to include responses in the near infrared spectral ranges. A preferred embodiment incorporates a microcrystalline copper indium diselenide/cadmium sulfide photodiode structure on a CMOS readout array. An alternate preferred embodiment incorporates a microcrystalline silicon germanium photodiode structure on a CMOS readout array. Each of these embodiments provides night vision with image performance that greatly surpasses the GEN III night vision technology in terms of enhanced sensitivity, pixel size and pixel count. Further advantages of the invention include low electrical bias voltages, low power consumption, compact packaging, and radiation hardness. In special preferred embodiments CMOS stitching technology is used to provide multi-million pixel focal plane array sensors. One embodiments of the invention made without stitching is a two-million pixel sensor. Other preferred embodiments available using stitching techniques include sensors with 250 million (or more) pixels fabricated on a single wafer. A particular application of these very high pixel count sensors is as a focal plane array for a rapid beam steering telescope in a low earth orbit satellite useful for tracking over a 1500-meter wide track with a resolution of 0.3 meter.

26 Claims, 27 Drawing Sheets

U.S. PATENT DOCUMENTS 5,599,403 A * 2/1997 Kariya et al. ............... 136/258
5,665,959 A * 9/1997 Fossum et al. ........... 250/208.1
6,252,218 B1 * 6/2001 Chou ....................... 250/208.1
6,399,873 B1 * 6/2002 Sano et al. .................. 136/249
6,759,262 B2 * 7/2004 Theil et al. .................... 438/48

* cited by examiner

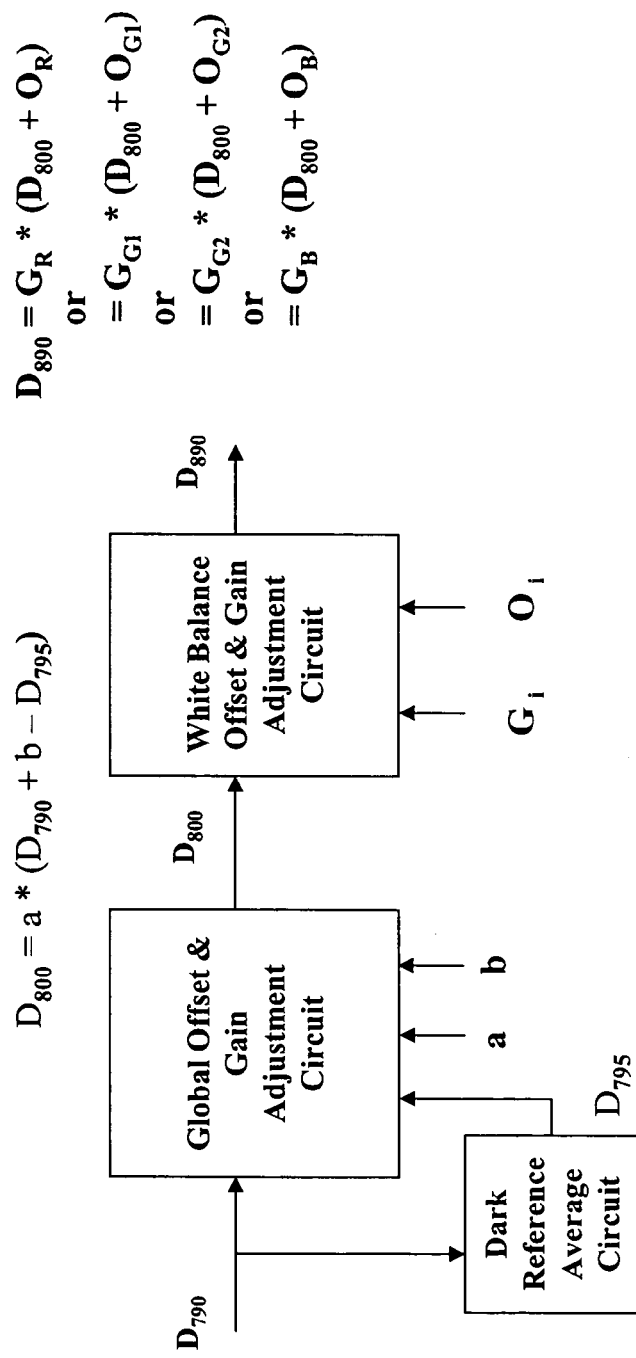
FIG. 1G Digital Signal Processing Chain
FIG. 1H Color Filter Array

| WAVELENGTH (nm) | Night Sky Spectral Irradiance From RCA E-O Handbook Photons/sec/m²/.05μ | GEN III Absolute Response, R₁ for Ksens= 1300μ A/l from Edward Bender mA/W averaged in 50 nm bins | QE | CIS Quantum Efficiency 0V Bias from EPV, Princeton, NJ |
|---|---|---|---|---|
| 375 | 4 · 10¹¹ | | | |
| 425 | 8 · 10¹¹ | | | |
| 475 | 1.4 · 10¹² | | | .55 |
| 525 | 1.6 · 10¹² | | | .67 |
| 575 | 2.5 · 10¹² | 18 | .04 | .83 |
| 625 | 2.6 · 10¹² | 138 | .27 | .83 |
| 675 | 3.0 · 10¹² | 165 | .30 | .83 |
| 725 | 3.2 · 10¹² | 172 | .29 | .82 |
| 775 | 6.0 · 10¹² | 170 | .27 | .81 |
| 825 | 6.3 · 10¹² | 148 | .22 | .82 |
| 875 | 1.1 · 10¹³ | 77 | .11 | .83 |
| 925 | 6.0 · 10¹² | | | .81 |
| 975 | 9.5 · 10¹² | | | .77 |
| 1025 | 3.0 · 10¹³ | | | .75 |
| 1075 | 3.3 · 10¹³ | | | .76 |
| 1125 | 1.7 · 10¹³ | | | .77 |
| 1175 | 1.6 · 10¹² | | | .72 |
| 1225 | 4.6 · 10¹³ | | | .40 |
| 1275 | 4.2 · 10¹³ | | | .06 |
| 1325 | 1.6 · 10¹² | | | |
| Total pe/sec/m² | | 6.8·10¹² | | 1.25·10¹⁴ |

FIG. 8

- ◆ Assumptions:
  - Scene reflectivity (Bender): 0.3
  - T# (Bender): 1.35
  - REF/T#2 = 0.16
  - Frame rate (Bender): 20 Hz
  - Pixel size: 20 μ
- ◆ Photoelectrons/Pixel
  - CIS: 400 pe/pixel/frame
  - GEN III: 22 pe/pixel/frame
- ◆ Noise Parameters:
  - GEN III noise figure (Bender): 2.0
  - CIS electronic noise: 10e-
- ◆ Resulting SNR:
  - CIS: 18     GEN III: 2.3
  - SNR improvement of 7.8

FIG. 9

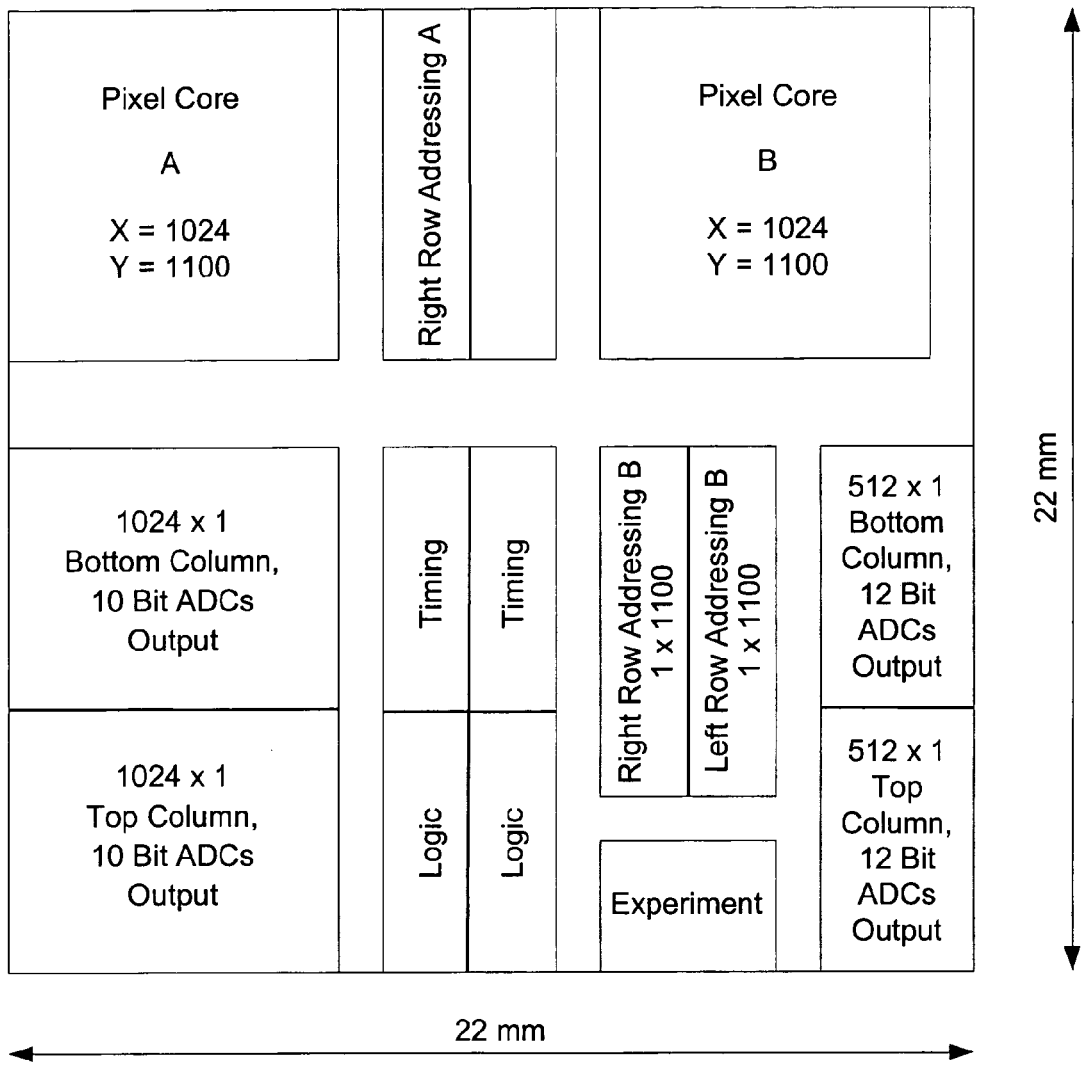

- Partitioning allows for great flexibility in wafer content
- Size of the image sensor is programmable in N x M array of pixel core blocks
- Allows for including experimental designs without risking baseline devices
- Image Sensor content can also be programmed, with multiple kinds of sensors coming off one wafer.
- Image sensor size limited only by the size of the wafer.

FIG. 14A

VISIBLE/NEAR INFRARED IMAGE SENSOR ARRAY

This application is a continuation in part of U.S. patent application Ser. No. 10/746,529, filed Dec. 23, 2003; Ser. No. 10/648,129 filed Aug. 26, 2003 now U.S. Pat. No. 6,809,358; Ser. No. 10/371,618, filed Feb. 22, 2003 now U.S. Pat. No. 6,730,900; Ser. No. 10/229,953 filed Aug. 27, 2002; Ser. No. 10/229,954 filed Aug. 27, 2002 now U.S. Pat. No. 6,791,130; Ser. No. 10/229,955 filed Aug. 27, 2002 now U.S. Pat. No. 7,411,233; Ser. No. 10/229,956 filed Aug. 27, 2002 now U.S. Pat. No. 6,798,033 and Ser. No. 10/072,637 filed Feb. 5, 2002 now U.S. Pat. No. 6,730,914. This patent application relates to image sensors and in particular to broad spectrum image sensors covering spectral ranges within the visible and near infrared spectral ranges.

BACKGROUND OF THE INVENTION

The prior art includes a variety of image sensors. Image sensors operating in the visible and near infrared spectrums have widespread utility for military and commercial applications.

Charge Coupled Devices

Charge coupled device (CCD) image sensors are pixelated readout arrays fabricated on and in a crystalline silicon substrate. These sensors convert incident light to electric charges that are collected in pixels formed in the substrate. Pixelated charge packets are typically transferred to the periphery of the array by a "bucket brigade" technique and are converted to voltage signals by charge sensitive amplifiers located at the periphery of the array. These voltage signals are digitized by an off-chip analog-to-digital converter. The photoresponse of these sensors is typically limited to the 400 nm-900 nm spectral range by the semiconductor bandgap properties of crystalline silicon.

CMOS Image Sensors

Complementary metal-oxide semiconductor (CMOS) sensors are produced using standard CMOS fabrication processes typically utilized for the fabrication of integrated circuits. CMOS sensors, like CCD's convert incident light to electric charge in electronic circuitry fabricated in or on the silicon substrate. The electric charge is electrically measured using multiple-transistors pixel circuitry and readout electronics also fabricated on the silicon die. The CMOS sensor photoresponse typically is also limited to the 400 nm-900 nm spectral range by the semiconductor bandgap properties of crystalline silicon. Also, in prior art CMOS sensors, the CMOS pixel circuitry obscures a major portion of each pixel's photosensitive area, resulting in low collection efficiency.

U.S. Pat. Nos. 5,528,043; 5,886,353; 5,998,794 and 6,163,030 are special examples of prior art patents utilizing CMOS circuits for imaging. These patents describe CMOS sensor technology developed by Applicants and their fellow workers in which a photodiode layer structure is produced in continuous layers on top of active CMOS pixels. U.S. Pat. No. 5,528,043 describes an X-ray detector utilizing a CMOS sensor array with readout circuits on a single chip. In that example image processing is handled by a separate processor. U.S. Pat. No. 5,886,353 describes a generic pixel architecture using a hydrogenated amorphous silicon layer structure in conjunction with CMOS circuits to form the pixel arrays. U.S. Pat. Nos. 5,998,794 and 6,163,030 describe various ways of making electrical contact to the underlying CMOS circuits in a pixel. All of the above U.S. patents are incorporated herein by reference.

Bump-Bonded Sensors

Hybridized bump-bonded sensors are fabricated by mechanically compressing a pixelated crystalline detector to a CMOS readout array. An electrically conductive indium ball located at each pixel provides the pixelated electrical connections. Typical bump-bonded sensors include crystalline silicon (400 nm-900 nm), indium gallium arsenide (900 nm-1600 nm), indium antinomide (3 microns-5 microns), and mercury cadmium telluride (12 microns-14 microns). The bump-bonding process using gallium arsenide or mercury cadmium telluride enables the sensors photoresponse to be extended to spectral regions outside of the crystalline silicon photoresponse. Bump bonding requires fairly large pixel sizes (typically 25-50 microns); this limits the achievable pixel count. To the best of Applicant's knowledge, bump-bonded detectors that span the visible and near infrared spectrum (400 nm-1500 nm) do not presently exist in the prior art.

Image Intensifier Sensors

State-of-the-art third generation (GEN III) night vision image intensifier sensors combine a crystalline gallium arsenide (GaAs) detector with an electrically biased micro-channel plate and a phosphor plate. The micro-channel plate consists of a regular array of open channels (such as an array with 15 micron minimum channel spacing) in a lead oxide glass material. The GaAs detector functions as a photocathode that ejects electrons in response to incident absorbed photons (that could be visible light or near infrared photons) with an efficiency of about 10 to 16 percent. The electrons are accelerated towards the micro-channel plate to produce a very large number of electrons (typically $10^4$-$10^6$) for each incident electron. The electrons from the micro-channel plate are then accelerated to the phosphor plate to produce a visible image on the phosphor plate representing the image of a field of view produced by the incident absorbed photons. The visible image may be viewed with the eye or a visible light image sensor such as a digital camera. Image intensifiers of this type detect photons over a limited spectral bandwidth (400 nm-900 nm). Also as stated above effective quantum efficiencies for these devices, which include noise contributions from the micro-channel plate amplification process, are quite low (10-16%). These devices require a vacuum and a high applied voltage (200 V-800 V) which results in bulky packaging and increased risk of damage. The 15 micron micro-channel spacing results in relatively large effective pixel sizes, which limits the pixel count.

There is a need for an image sensor with enhanced sensitivity, small pixel size and large pixel count that can provide high image performance in spectral ranges that extend beyond the spectral photosensitivity range of crystalline silicon.

SUMMARY OF THE INVENTION

The present invention provides a MOS or CMOS sensor for high performance imaging in broad spectral ranges including portions of the infrared spectral band. These broad spectral ranges may also include portions or all of the visible spectrum, therefore the sensor has both daylight and night vision capabilities. The sensor includes a continuous multi-layer photodiode structure on a many pixel MOS or CMOS readout array where the photodiode structure is chosen to include responses in the near infrared spectral ranges. A preferred embodiment incorporates a microcrystalline copper indium diselenide/cadmium sulfide photodiode structure on a CMOS readout array. An alternate preferred embodiment incorporates a microcrystalline silicon germanium photodiode structure on a CMOS readout array. Each of these embodiments provides night vision with image performance that greatly surpasses the GEN III night vision technology in terms of enhanced sensitivity, pixel size and pixel count. Further advantages of the invention include low electrical bias voltages, low power consumption, compact packaging, and radiation hardness. In special preferred embodiments CMOS stitching technology is used to provide multi-million pixel focal plane array sensors. One embodiment of the invention made without stitching is a two-million pixel sensor. Other preferred embodiments available using stitching techniques include sensors with 250 million (or more) pixels fabricated on a single wafer. A particular application of these very high pixel count sensors is as a focal plane array for a rapid beam steering telescope in a low earth orbit satellite useful for tracking over a 1500-meter wide track with a resolution of 0.3 meter.

BRIEF DESCRIPTION OF THE DRAWINGS

FIGS. 1A through 1H show features of a 2-million pixel CMOS sensor.

FIG. 8 shows a table of the CIS quantum efficiency and the night sky irradiance versus wavelength.

FIG. 9 shows the signal-to-noise calculations for a CIS POAP image sensor and a GEN III image sensor.

FIG. 14A shows the reticle mask for the specialized CMOS stitching fabrication technique.

DETAILED DESCRIPTION OF PREFERRED EMBODIMENTS

Two Million Pixel CMOS Sensor

General Description

Some features of a two-million pixel CMOS sensor are shown in FIGS. 1A through 1H. This sensor is fabricated by depositing a multi-layer photodiode structure on top of an electronic readout array that is fabricated using complimentary metal-oxide semiconductor (CMOS) methods commonly utilized in integrated circuit manufacturing. Absorbed photons create charge pairs in the photodiode structure and the liberated electric charge migrates under the influence of an applied electric field to pixel pads in the CMOS readout array where the charges are stored on capacitors, each capacitor representing a pixel. Active pixel circuitry at each pixel produces an amplified voltage proportional to the stored electric charge. CMOS readout circuitry, that may be located at the periphery of each array column, further amplifies and digitizes the pixel signal. Additional pixel circuitry provides digital multiplexing of the digitized pixel signals, pixel selection during the readout process, and a reset function that discharges the pixel capacitor. The patents listed in the Background Section as well as the parent patent applications listed in the first sentence of this application (all of which patents and patent applications are incorporated herein by reference) provide details of the fabrication and operation of these CMOS sensor arrays in addition to the specific details provided below.

Transistor Portion

Figure 1A:
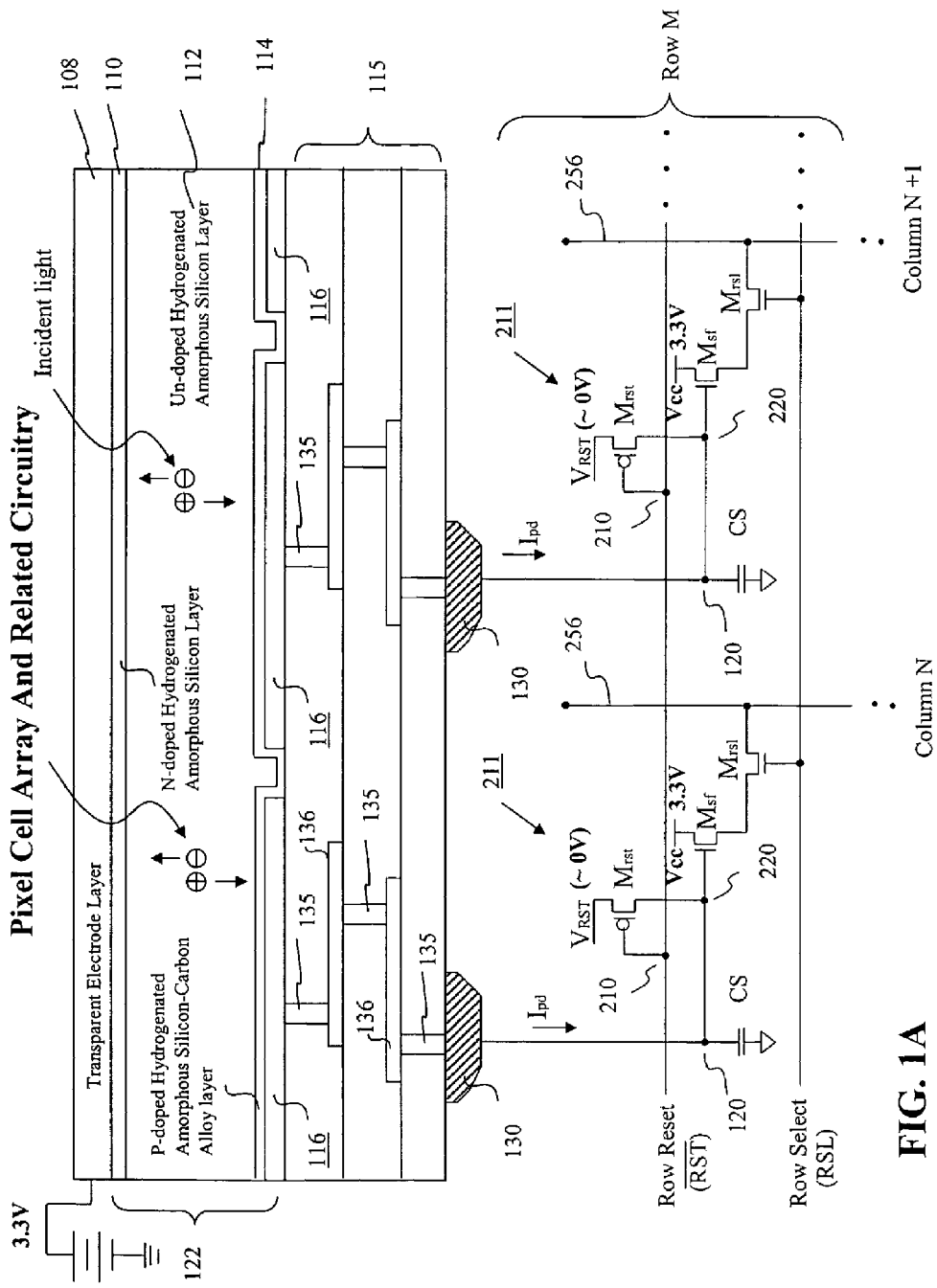
Figure 1A:
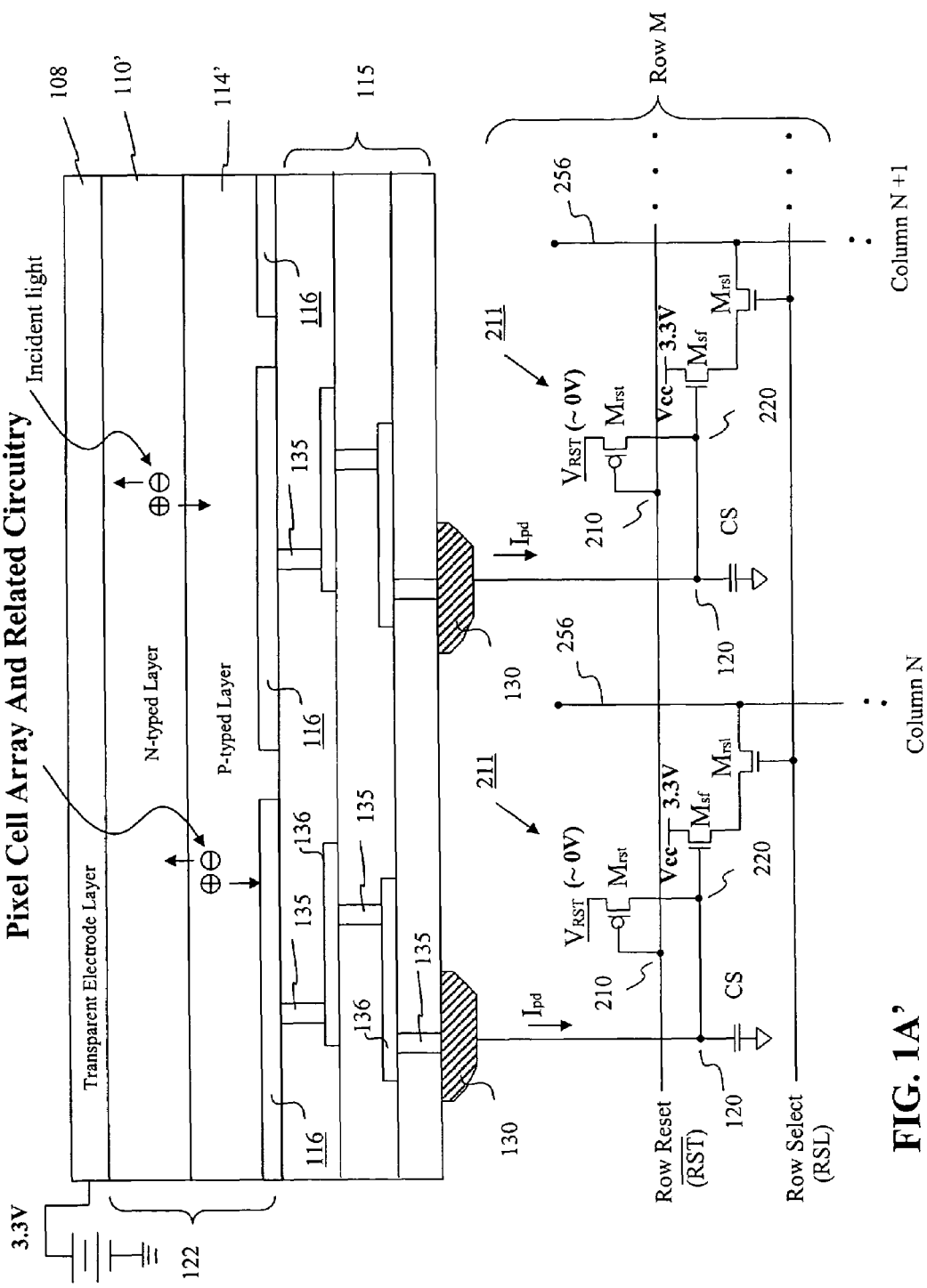
Figure 1B:
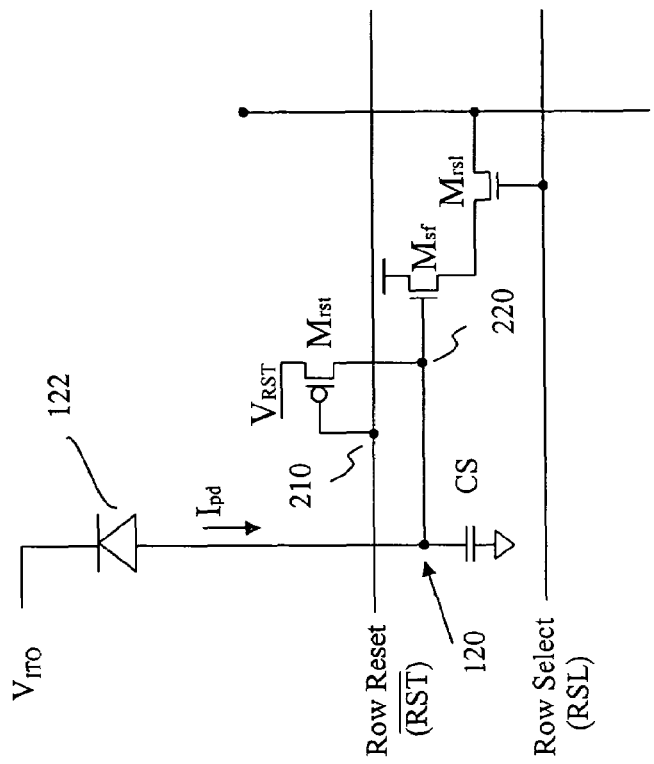

Two pixels of the two-million pixels cell array and related circuitry is shown in FIG. 1A. A preferred pixel configuration of 1082 rows and 1928 columns is shown in FIG. 1D. The transistor portions of the pixels are shown at 211 as integrated circuits in electrical schematic form in FIG. 1A. FIG. 1B is an electrical schematic drawing showing only the transistor portion of a single pixel circuit and the photodiode portion of the pixel, all in schematic form. These integrated pixel circuits are produced in and on a silicon substrate using standard CMOS techniques. The various photodiode portions of each pixel are laid down in continuous layers on top of the integrated circuits and are shown in FIG. 1A as actual layers. Each pixel comprises an impurity-doped diffusion region 130 that is a portion of the reset transistor $M_{rst}$ and represents a part of the charge collection node 120 as shown in FIG. 1B.

Pixel electrode 116, shown in FIG. 1A is connected to charge collecting node 120. Pixel circuit 211 includes collection capacitor CS, source follower buffer Msf, selection transistor Mrs1 and reset transistor Mrst. Transistor portion 211 uses p-channel transistors for reset transistor Mrst and n-channel transistors for source follower transistor Msf and selection transistor Mrs1. The voltage at COL (out) 256 is proportional to the charge Q(in) stored on the collection capacitor CS. By reading this node twice, once after the exposure to light and once after the reset, the voltage difference is a direct proportional to the amount of light producing charge pairs in the pixel. Transistor portion 211 is referenced to a positive voltage Vcc at node 262 (typically 2.5 to 5 Volts). Pixel circuitry for this array is described in more detail in the '353 patent.

An alternate embodiment is a two-transistor pixel circuit design, where it does not use the source follower transistor Msf in FIG. 1A. Sensors incorporated with this 2-transistor design are called "passive pixel sensor"(PPS). The preferred embodiment, using 3-transistor pixel circuit design, is usually referred as "active pixel sensor" (APS). Compared to the passive pixel sensor, APS has better noise immunity during readout.

Interconnect Structure

The array includes an interconnect structure 115 comprised of dielectric layers providing insulation and electrical interconnections of various elements of the pixel cell array. These interconnections include a set of vias 135 and metalized regions 136 for each pixel connecting diffusion region 130 with patterned electrode pads 116 formed on top of the interconnect structure 115. Interconnect structure 115, with metalized regions 136 and vias 135 are produced using standard CMOS fabrication techniques. In the standard CMOS fabrication process, metal lines are formed of a stack of Titanium Nitride (TiN) and Aluminum layers, where Aluminum lines are stacked on top of TiN lines and TiN is making contact with the vias. Aluminum has very high diffusivity with amorphous silicon; therefore, in this embodiment electrode 116 made of Titanium Nitride without a top Aluminum layer. This technique is an important improvement developed by Applicants to improve sensor performance. Other metals, such as Titanium, Tungsten, Titanium-Tungsten alloy and Tungsten Nitride, can be used as well. But Titanium Nitride is readily available in a typical CMOS process; therefore, it is Applicants' preferred material to prevent diffusion of Aluminum.

Photodiode Layer (For Visible Light Sensor)

FIG. 1A shows a photodiode layer designed for a visible light sensor for a spectral range of about 400 nm to about 900 nm. Each pixel includes an n-i-p photodiode portion formed by continuous layers laid down on top of the interconnect structure 115 and patterned electrode pads 116. In this case the n-i-p photodiode structure is reverse biased with the top electrode 108 at a potential of +3.3 Volts and the collection electron 116 at a potential of about +2.0 Volts at the beginning of each collection cycle as a consequence of the reset voltage VRST being ground (zero Volts). With this configuration positive charges created by photons in the i-layer 112 will flow downward to electrodes 114 to increase the potential on capacitor CS and negative charges will flow upward to electrode 108. (The reader should note here that in some embodiments of the present invention there are advantages in collecting negative charges in the pixels. In this case the reset potential is at a higher voltage than the potential of the top electrode and the layer just below the top electrode is a p-layer and the layer just above the pixel electrode 116 is an n-layer. In referring to these layer diode structures in this application we will read from the top down so that the structure shown in FIG. 1A is an n-i-p structure and the one just described above is a p-i-n structure. In the p-i-n structure the positive charges will flow upward to the top electrode during the charge collecting cycle and the negative charges will flow downward and will be collected on the pixel electrodes reducing the potential of the pixel capacitors.) The lowest of the photodiode layers, p-layer 114, is about 0.01 micron thick and is comprised of p-doped hydrogenated amorphous silicon. This layer preferably also includes carbon at concentrations between about 5 to 35 percent. (Carbon concentrations as high as 50 percent could be used. In prototype devices actually built and tested by Applicants, the carbon concentration was about 30 percent.) Applicants have discovered that carbon doping at this concentration does not significantly adversely affect the quality of this layer as a p-type semiconductor but does substantially increase the electrical resistivity of the layer. This issue is discussed in more detail below. The next higher layer, layer 112 is an intrinsic layer of the n-i-p photodiode region of the array. It is hydrogenated amorphous silicon with no doping and is in this embodiment about 0.5 to 1.0 micron thick. The top photodiode layer 110 is n-doped hydrogenated amorphous silicon and is about 0.005 to 0.01 micron thick. A transparent electrode layer 108 is a layer of indium tin oxide deposited on top of n-layer 108 about 0.06 micron thick. This material is electrically conductive and also transparent to visible light.

Sensor Array Circuitry

Figure 1C:
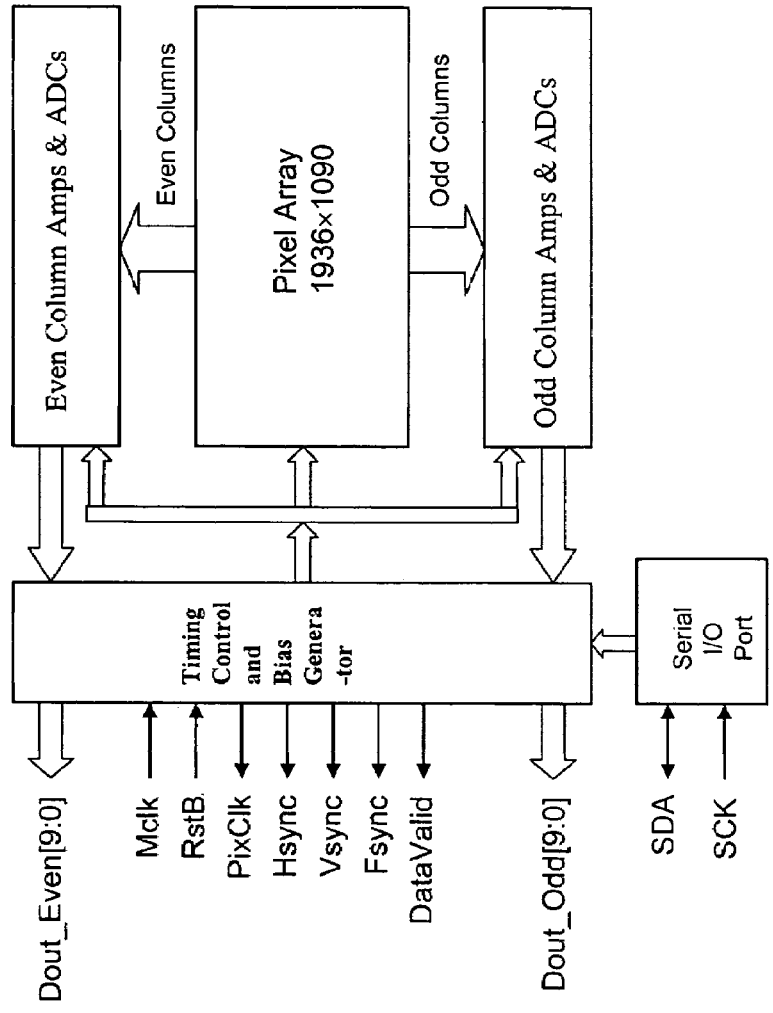
Figure 1D:
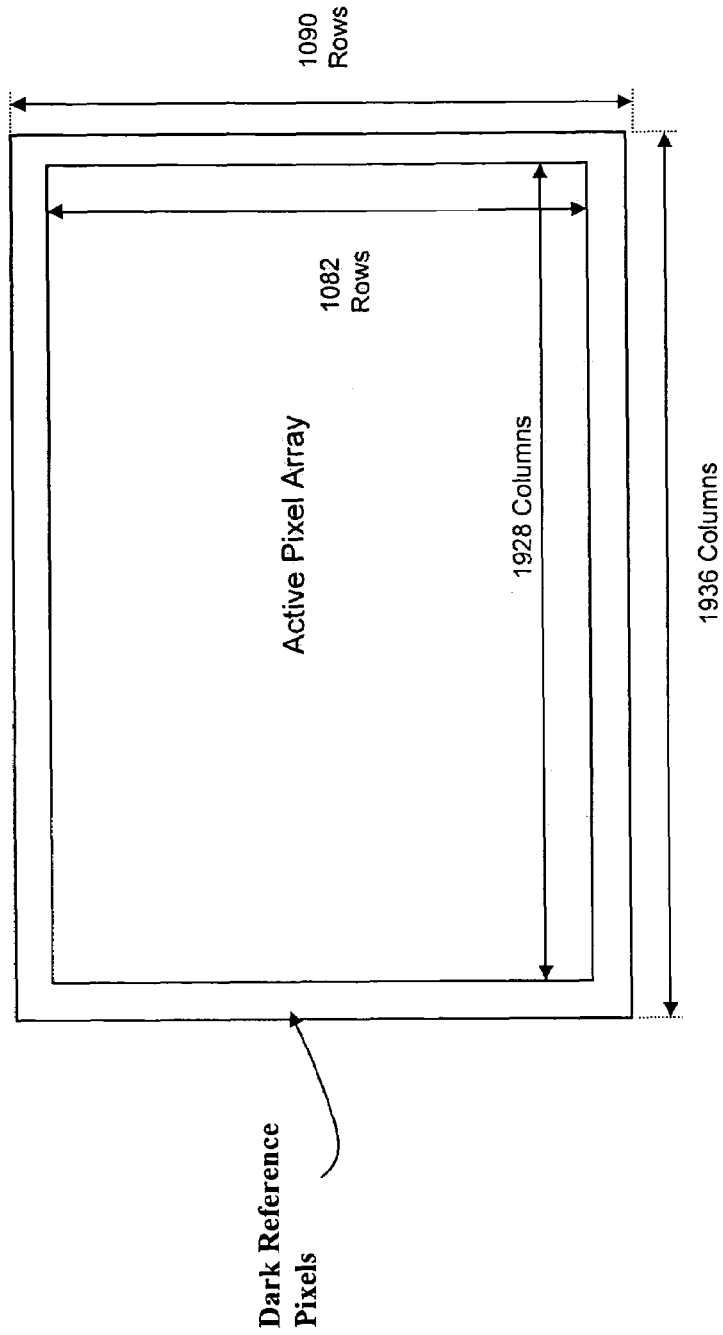
Figure 1E:
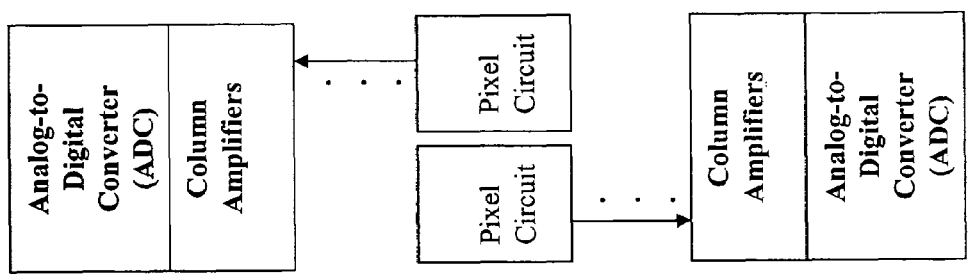
Figure 1F:
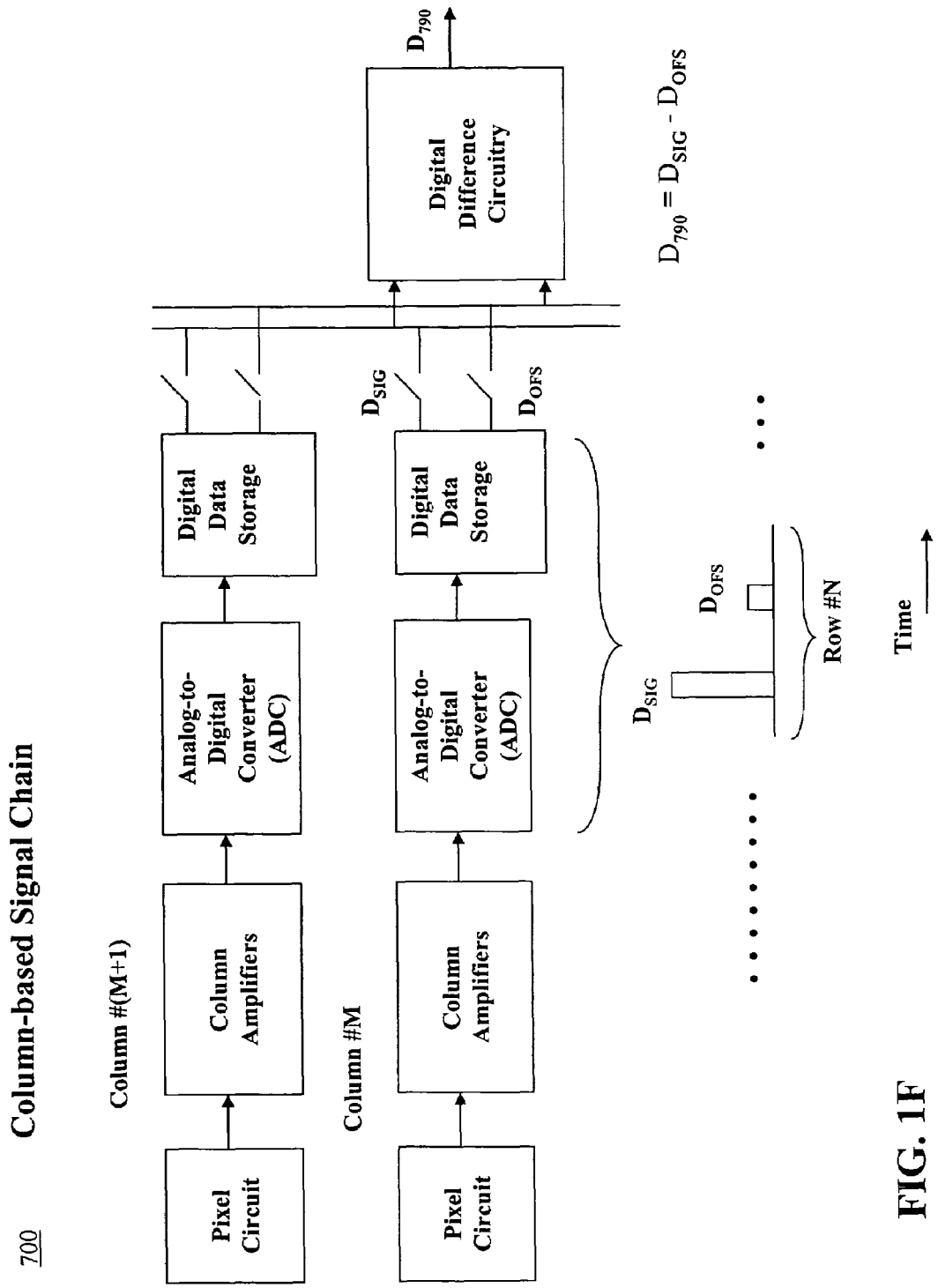

A block diagram of the sensor array circuitry for the two millions pixel array is shown in FIG. 1C. In Applicants' design, 1936×1090 pixels form the pixel array. This sensor design uses architecture with Column-Parallel Analog-to-Digital conversion (ADC), where each column has its own ADC. For image sensors, typically, the ADC requires 10-bits accuracy. A 10-bit and 60 MHz ADC itself requires the state-of-the-arts design, which may require fabrication processes beyond a typical CMOS based process. Worse than that, it generates a lot of noise and heat that affect the overall sensor performance. In contrast, Column-Parallel ADC can run at the frequency at "line rate" which, in Applicants' two millions pixel sensor, is about a factor of 1000 slower than the pixel rate. This allows Applicants to use much simpler CMOS-process-compatible ADC designs. Because of the slow conversion rate, the noise and heat can be reduced leading to better sensor performance. In FIG. 1C, the timing control and bias generator circuitry on chip generate all the timing clocks and voltages required to operate the on-chip circuitry. They are to simplify the interface between the sensor and other camera electronics, and they allow sensor users to use a single master clock and single supply voltage. These are desirable features in sensor application. In Applicants' two million pixels sensor design, there are two 10-bit video output ports, as shown in FIG. 1C, Dout-Even [9:0] and Dout_Odd [9:0] representing the video output from even columns and odd columns, respectively. Not shown in the figure is an option that allows the sensor users to select an option to use only a single 10-bit port for video output. This single port design allows Applicants to use a smaller chip carrier because at least ten I/O pins can be removed. However, to support the single-port output, Applicants use a switch design that multiplexes the even and odd column video to have the right sequence. This switch needs to operate at higher frequency, and possible higher noise. In some applications, users might want to use the two-port output in order to reduce the noise caused by any elements running at high frequency on chip. For reasons such as these, in Applicants' embodiment the choice of single-port vs. two-ports is an option to sensor users. In Applicants' two-million pixel sensor, a serial I/O port is designed to allow sensor users to read and change some of the parameters for running the sensor. Applicants' two million-pixel sensor has 1928×1082 active pixels. As shown in FIG. 1D surrounding the active pixel region are 4 pixel regions covered with visible light shields that can be used as dark reference. FIG. 1E shows Applicants' design to separate the even and odd columns so one set would come from top and one set would come from the bottom. FIG. 1F shows the column-based signal chain of Applicants' two million pixels sensor design. The signal coming out of the pixel region will be held and sampled into the column amplifier circuit. In the design, sensor users are allowed to program the amplification factor depending upon the signal level. The sensor uses other on-chip intelligence to automatically change the amplification factors. At this point, the signal is still analog in nature. Then this signal goes to the column-based ADC to be converted into digital signal. In Applicants design, there are two ADC conversions, one is for the signal and another one is for the reference. Applicants call this technique Delta Double Sampling (DDS). This technique allows Applicants to remove any offset the signal may experience when it passes physically from the pixel region to ADC region. It reduces the fixed pattern noise, commonly a major weakness for CMOS-based Active Pixel Sensor (APS). After DDS, the offset-cancelled digital signal is fetched into the digital signal processing chain, shown in FIG. 1G. FIG. 1H shows a preferred color filter pattern. The signal goes into the Global Offset and Gain Adjustment Circuit (GOGAC) and Dark Reference Average Circuit (DRAC) at the same time. The DRAC circuit calculates the average in the dark reference pixel region, which can provide the signal level representing Dark. In the GOGAC circuit, the gain and offset are applied to the incoming digital signal. After that the digital signal is fetched into the White Balance Offset and Gain Adjustment Circuit (WBOGAC). WBOGAC applies a separate gain and offset according to the color filter the pixel is covered with. The purpose of it is to achieve a white-balanced signal under various light-sources. The parameters can be programmed in by the sensor users or by the on-chip intelligence.

Specifications for Two-Million Pixel Sensor

Applicants have built and tested a prototype two-million pixel sensor as shown in FIGS. 1A through FIG. 1I. This sensor is ideally suited for use as a camera for high definition television, cellular phone cameras, surveillance cameras, embedded cameras on portable computers, PDA cameras and digital still cameras. Applicant's specifications for this sensor are summarized below:

1. Photo-sensing layer:
   a. n-i-p photodiode structure;
   b. n-i-p is made of hydrogenated amorphous silicon;
   c. n-i-p layers are un-patterned;
   d. a surface electrode layer covers over the n-i-p layer structure;
   e. the surface electrode layer is un-patterned;
   f. the surface electrode layer is transparent to visible light;
   g. the surface electrode layer is Indium Tin Oxide (ITO);
   h. the surface electrode layer is electrically biased to a constant voltage;
   i. the constant voltage in Item H is around 3.3V;
   j. a conductive pixel electrode covers substantial area of a said pixel;
   k. a electrical field is established across the n-i-p layers by applying voltages drop between the surface electrode and metal pixel electrode;
   l. p-layer is doped with p-type impurity;
   m. I-layer is un-intentionally doped intrinsic layer;
   n. n-layer is doped with n-type impurity;
   o. p-layer is the layer making electrical and physical contact to the conductive pixel electrode and through the pixel electrode to the underlying CMOS pixel circuitry electrically;
   p. p-layer is very resistive to avoid pixel-to-pixel crosstalk;
   q. the high resistivity in p-layer is achieved by adding carbon atoms or molecules into P layer;
   r. Item j is made of metal;
   s. Item j is made of metallic nitride;
   t. Item j is made of Titanium Nitride;
2. Pixel Circuitry:
   a. has an insulating layer, fabricated with the known semiconductor process, between the conductive pixel electrode and underlying pixel circuitry;
   b. has at least one via, passing through the insulating layer, connecting electrically the said pixel electrode to said underlying pixel circuitry;
   c. each pixel comprises of a charge collection node, charge sense node, charge storage circuitry, signal reset circuitry and signal readout selection circuitry;
   d. each pixel circuit comprises of three transistors;
   e. the gate of one of the transistor is electrically connected to the charge sense node;
   f. one of the transistor is used for signal reset to a known state;
   g. one of the transistor is used for signal readout selection;
   h. Another embodiment is not to use Items (a) and (b) and have the pixel electrode making direct physical and electrical contact to the diffusion area of the reset transistor (Item f).
3. Array Circuitry:
   a. the sensor array has 2 million pixels;
   b. each pixel is 5 um×5 um;
   c. the 2 million pixels is formed as 1928 (columns)× 1082 (rows) active area;
   d. minimum four metal covered pixels, 4 pixels wide, surround the active area;
   e. the metal covered pixels are used to establish a dark reference for the array;
   f. each column has an analog-to-digital converter (ADC);
   g. each column has circuits for signal condition, signal amplification and sample-and-hold;
   h. the array is arranged to have the signal of even columns and odd columns coming out of from the top and bottom of the array, separately;
   i. Items F and G are designed to with the width of two pixels wide;
   j. A delta double sampling (DDS) scheme is used to sample the signal and reference voltages consecutively;
   k. the sampled signal and reference voltages are converted by the column ADC into digital signals;
   l. the difference between the said signals in Item k determines the light level detected by the photo-sensing device;
   m. there are two output data ports, one for even columns and one for odd columns
   n. the sensor has on-chip circuit to multiplex the even and odd column output to make a pixel-sequential video output through a single port;
   o. the sensor has on-chip circuit to accept one single voltage input and generates all bias voltages needed to run various circuits on chip;

p. the sensor has an option not to use the circuit of Item O but to accept multiple voltage inputs to run various circuits on chip;
q. Item G has circuitry providing the selection of multiple signal amplification factors;
r. the multiple signal amplification factor covers 1× to 8×, with 256 increments;
s. the fine increment of amplification factor is to allow fine adjustment for auto exposure control;
t. the sensor array can be covered with color filter;
u. the color filters comprises of Red, Green and Blue filters;
v. the color filter array is arranged with four pixels as a unit, the upper-left pixel covered with Red filter, the upper-right covered with Green filter, the lower-left covered with Green filter and the lower-right covered with Blue filter;
w. there is a timing circuitry on the same chip, which provides all the clocks necessary to operate the pixel and readout circuitry;
x. the timing circuitry also provides the synchronization (pixel, line and frame) signals which enables other chips to interface with this image sensor;
y. the timing circuitry also provide timing control for light exposure time;
z. there are circuits on chip to provide some of the bias voltage to operate other parts of the circuit;
aa. the array and pixel circuits are fabricated with CMOS process.

Crosstalk Reduction

With the basic design of the present invention where the photodiode layers are continuous layers covering pixel electrodes, the potential for crosstalk between adjacent pixels is an issue. For example, when one of two adjacent pixels is illuminated with radiation that is much more intense than the radiation received by its neighbor, the electric potential difference between the surface electrode and the pixel electrode of the intensely radiated pixel will become substantially reduced as compared to its less illuminated neighbor. Therefore, there could be a tendency for charges generated in the intensely illuminated pixel to drift over to the neighbor's pixel electrode.

In the case of a three-transistor unit cell design, the photo-generated charge is collected on a capacitor at the unit cell. As this capacitor charges, the voltage at the pixel contact swings from the initial reset voltage to a maximum voltage, which occurs when the capacitor has received its total charge for the charge-collection interval. A typical voltage swing is 1.4V. Due to the continuous nature of Applicant's coating, there is the potential for charge leakage between adjacent pixels when the sense nodes of those pixels are charged to different levels. For example, if a pixel is fully charged and an adjacent pixel is fully discharged, a voltage differential of about 1.4V will exist between them. There is a need to isolate the sense nodes among pixels so crosstalk can be minimized or eliminated.

Gate-Biased Transistor

As explained in Applicant's parent patent application Ser. No. 10/072,637 that has been incorporated herein by reference, a gate-biased transistor can be used to isolate the pixel sense nodes while maintaining all of the pixel electrodes at substantially equal potential so crosstalk is minimized or eliminated. However, an additional transistor in each pixel adds complexity to the pixel circuit and provides an additional means for pixel failure. Therefore, a less complicated means of reducing crosstalk is desirable.

Increased Resistivity in Bottom Photodiode Layer

Applicants have discovered that crosstalk between pixel electrodes can be significantly reduced or almost completely eliminated in preferred embodiments of the present invention through careful control of the design of the bottom photodiode layer without a need for a gate-biased transistor. The key elements necessary for the control of pixel crosstalk are the spacing between pixel contacts and the thickness and resistivity of the photodiode layers. These elements are simultaneously optimized to control the pixel crosstalk, while maintaining all other sensor performance parameters within desired ranges. The key issues related to each variation are described below.

1. Pixel Contact Spacing

Increased spacing, l, between pixel contacts increases the effective resistance between the pixels, as described in the relationship between resistance and resistivity.

$$R = \rho \frac{l}{t \cdot w} \quad \text{(Eq. 1)}$$

The spacing between pixel contacts is a consequence of the designed pixel pitch and pixel contact area. From the geometric configuration alone, we can create a differentiation so carriers would favor one direction over the other. For example, along the vertical direction, the resistance becomes $R_v = \rho \times T/(W \times L)$, where $\rho$ is the resistivity, T is the p-layer thickness, W is the pixel width and L is the pixel length. In most cases W=L, therefore, we can get $$R_v = \rho \times T/W^2$$

On the other hand, along the lateral direction, the resistance becomes $$R_l = \rho/T.$$

The resistance ratio between lateral and vertical is $$R_l/R_v = (W/T)^2$$

This can create a preferred carrier flow direction, favorable in vertical direction, as long as W/T>1. In Applicants' practice, the p-layer thickness is around 0.01 um and pixel width is about 5 um, W/T=500 which is much greater than 1. Of course, the final pixel contact size must be selected based on simultaneous optimization of all sensor performance parameters.

2. Layer Thickness

Decreasing the coating thickness, t, results in an increase in the effective inter-pixel resistance as described in equation 1. In the case of an amorphous silicon n-i-p diode, the layer in question is the bottom p-layer. In the case of an amorphous silicon p-i-n diode, it is the bottom n-layer. In both cases, only the bottom doped layer is considered because the potential barriers that occur at the junctions with the i-layer prevent significant leakage of collected charge back into the i-layer. Also in both cases, there is a practical limit to the minimum layer thickness, beyond which the junction quality is degraded.

3. Coating Resistivity

The parameter in Equation 1 that allows the largest variation in the effective resistance is $\rho$, the resistivity of the bottom layer. This parameter can be varied over several orders of magnitude by varying the chemical composition of the layer in question. In the case of the amorphous silicon N-layer and P-layer discussed above, the resistivity is controlled by alloying the doped amorphous silicon with carbon and/or varying the dopant concentration. The resulting doped P-layer or N-layer film can be fabricated with resistivity ranging from 100 Ω-cm to more than $10^{11}$ Ω-cm. The incorporation of a very high-resistivity doped layer in an amorphous silicon photodiode might decreases the electric field strength within the I-layer, therefore whole sensor performance must be considered when optimizing the bottom doped layer resistivity.

Carbon Preferred for Increased Resistivity

The growth of a high-resistivity amorphous silicon based film can be achieved by alloying the silicon with another material resulting in a wider band gap and thus higher resistivity. It is also necessary that the material not act as a dopant providing free carriers within the alloy. The elements known to alloy with amorphous silicon are germanium, tin, oxygen, nitrogen and carbon. Of these, alloys of germanium and tin result in a narrowed band gap and alloys of oxygen, nitrogen and carbon result in a widened band gap. Alloying of amorphous silicon with oxygen and nitrogen result in very resistive, insulating materials. However, silicon-carbon alloys allow controlled increase of resistivity as a function of the amount of incorporated carbon. Furthermore, silicon-carbon alloy can be doped both n-type and p-type by use of phosphorus and boron, respectively.

Amorphous silicon based films are typically grown by plasma enhanced chemical vapor deposition (PECVD). In this deposition process the film constituents are supplied through feedstock gasses that are decomposed by means of a low-power plasma. Silane or di-silane are typically used for silicon feedstock gasses. The carbon for silicon-carbon alloys is typically provided through the use of methane gas, however ethylene, xylene, dimethyl-silane (DMS) and trimethyl-silane (TMS) have also been used to varying degrees of success. Doping may be introduced by means of phosphene or diborane gases.

Preferred Process for Making Photodiode Layers

In Applicants' current practice for a n-i-p diode layer structure, the p-layer, which is making contact with the pixel electrode, has a thickness of about 0.01 microns. The pixel size is 5 microns×5 microns. Because of the aspect ratio between the thickness and pixel width (or length) is much smaller than 1, within the P-layer the resistance along the lateral (along the pixel width/length direction) is substantially higher than the vertical direction, based upon Equation 1. Because of this, the electrical carriers prefer to flow in the vertical direction than in the lateral direction. This alone may not be sufficient to ensure that the crosstalk is low enough. Therefore, Applicants prefer to increase the resistivity by introducing carbon atoms into p-layer to make it become a wider band-gap material. Our preferred p-layer is a hydrogenated amorphous silicon layer with carbon concentration about $10^{22}$ atoms/cc. The hydrogen content in this layer is in the order of $10^{21}$-$10^{22}$ atoms/cc, and the p-type impurity (Boron) concentration in the order of $10^{20}$-$10^{21}$ atoms/cc. This results in a film resistivity of about $10^{10}$ ohm-cm. For a 5-micron×5-micron pixel, we have found out that negligible pixel crosstalk can be achieved even when the p-layer resistivity is down to about 2-3×$10^7$ ohm-cm. Like what is described above, there is a need of engineering trade-offs among p-layer thickness, carbon concentration, boron concentration and pixel size to achieve the required overall sensor performance. Therefore, the resistivity requirement may vary for other pixel sizes and configurations. For this n-i-p diode with 5-micron×5-micron pixel, our I-layer is an intrinsic hydrogenated amorphous silicon with a thickness about 0.5-1 micron. The n-layer is also a hydrogenated amorphous silicon layer with n-type impurity (Phosphorous) concentration in the order of $10^{20}$ to $10^{21}$ atoms/cc.

For applications where the polarity of the photodiode layers are reversed and the n-layer is adjacent to the pixel electrode, the carbon atoms/molecules are added to the n-layer to reduce crosstalk.

The Physics of Continuous Photodiode Layer Structures

Layered photodiode structures of the type shown in FIG. 1A have great practical advantages over conventional crystalline photodiode structures that are either grown epitaxially on CMOS readout arrays, or bump bonded to CMOS readout arrays. Crystalline photodiode structures, such as crystalline silicon, for example, feature a perfectly periodic spacing of atoms with very few impurities or crystal dislocations. These structures may be mathematically modeled. According to models typically utilized, energy potential of each atom, combined with a wave function representation of the mobile charges, results in an energy band gap between the valence and conduction bands. Incident photons provide the energy to elevate the electron energy from the valence band to the conduction band, thereby creating mobile charges. The near perfect order of the crystalline semiconductor, and relative absence of impurities or dislocations, results in a very low density of states in the energy band gap and a high mobility of charges. The addition of p and n dopant layers provides p-i-n or p-n photodiode structures with spatial depletion regions that permit electrical separation of liberated pairs produced by incident photons. This enables efficient light detection of light at wavelengths $\lambda_B$ corresponding to photon energies above the band gap energy $E_B$. That is $\lambda_B < hc/E_B$, where h is Planck's constant and c is the speed of light. The band gap also enables suppression of thermally generated dark noise that ultimately limits the imaging performance.

An amorphous p-i-n photodiode structure fabricated from hydrogenated amorphous silicon (a-Si:H) has similar light absorption properties as a crystalline p-i-n photodiode. The amorphous p, i and n layers feature a disordered, but somewhat periodic, spacing of the silicon atoms; these atoms are surrounded by a plurality of hydrogen atoms. The bulk semiconductor properties arise from averaging the microscopic features of the photodiode structure over the effective photon detection width x of an incident photon (where x=1.22 λf# where f# is the f-number of the optical system and λ is the wavelength of the incident photon). This value x=1.22 λf# is hereinafter referred to as the effective photon width. The periodicity of the silicon atoms in the amorphous photodiode has enough definition over the distance x so that the photon essentially sees a semiconductor material with a forbidden energy bandgap separating conduction and valence bands, and a spatial depletion region primarily in the i-layer. The forbidden energy bandgap in an amorphous material tends to feature a much larger density of energy states than in a crystalline semiconductor material due to the amorphous nature of the material. This leads to increased dark current and lower mobility of charges in an amorphous photodiode material. However, the density of states can be controlled in an amorphous material so that the achievable image performance is limited by the CMOS readout array on which the amorphous photodiode structure is applied.

The major practical advantage of amorphous photodiode structures involves the elastic nature of amorphous materials. Amorphous materials, such as amorphous silicon, can gracefully incur much larger stresses because the silicon atoms are imbedded in a sea of hydrogen atoms; the hydrogen bonds provide material elasticity that enables the amorphous materials to be coated on material varying (i.e. metal pixel pads separated by silicon dioxide insulator, for example) or even topologically varying CMOS readout arrays. In comparison, crystalline materials, fabricated using molecular beam epitaxy (MBE), require precise lattice matching to a flat underlying crystalline substrate, in order to minimize the interface stress.

Microcrystalline photodiode structures, such as a microcrystalline silicon p-i-n photodiode, for example, feature very small (10-100 nm) crystal structures imbedded in amorphous material layers in a disordered fashion. The average size of the microcrystallites, determined by the coating parameters, is much smaller than the photon wavelength, the effective photon width x, and the pixel size of the CMOS readout array. The semiconductor properties of microcrystalline photodiodes, such as dark current and charge mobility, are primarily determined by the impurities and dislocations along the grain boundaries of the micro-crystallites. The microcrystalline values of dark current and charge mobility typically lie between published values of dark current and charge mobility of the amorphous and crystalline materials making up the microcrystalline material. As a natural extension of this simple p-i-n photodiode structure, the intrinsic layer can be comprised of one intrinsic amorphous silicon layer and one intrinsic microcrystalline silicon layer. This composite-intrinsic layer allows a sensor to utilize the efficient light sensing to visible spectrum by amorphous silicon layer and the efficient light sensing to near IR spectrum by microcrystalline silicon.

By coating the amorphous or microcrystalline photodiode structure over the CMOS readout circuitry, the resulting sensor has a near-unity fill factor. This feature potentially results in near unity quantum efficiency for a specific wavelength band. This provides a distinct advantage over a front-illuminated charge-coupled device (CCD) or conventional CMOS imagers, both which effectively shield a large portion of the pixel's active photo-converter area with overlying readout circuitry.

Various Types of Photodiode Layer Structures

The present invention provides the opportunity to tailor the spectral response of sensor arrays to various desired spectral ranges by appropriate choice of the material used for the layers making up the continuous photodiode layer structure shown for example as photodiode layer structure 122 in FIG. 1A. Four of these preferred layer structures are described in detail below. Three of these structures provide responses in the near infrared. Techniques are also described for modifying each of the four structures to expand the spectral range into the ultraviolet spectral range.

Amorphous Silicon Photodiode

In the first preferred embodiment of the present invention, the photodiode layers are n-i-p layers comprised of hydrogenated amorphous silicon (a-Si:H). They are applied over the pixelated surface of a CMOS readout array that has been designed to provide electrical contact to the photodiode at each pixel. In this embodiment the photodiode is operated with a −1 V reverse bias voltage to provide an enhanced electric field across the i-layer to allow efficient collection of photo-generated charge.

The a-Si:H photodiode structures is fabricated using by plasma enhanced chemical vapor deposition. In this process, feedstock gases are delivered to a vacuum chamber and dissociated by means of radio frequency plasma. Once the gases are broken down, the resulting radicals react at all exposed surfaces, resulting in film growth. The first deposited layer is a p-type impurity doped layer that is produced using silane ($SiH_4$) gas with a small addition of boron; this p-layer is typically 50-700 angstroms thick. The next deposited layer that is the intrinsic amorphous silicon i-layer that primarily incorporates silane gas; this i-layer is typically 0.5-1 micron thick. The third deposited layer is an n-type impurity doped layer that combines silane gas with a small addition of phosphorus; this n-layer is typically 50-700 angstroms thick. An indium-tin oxide (ITO) top electrode layer is deposited on the n-layer to provide the conductive top surface to apply the electric bias field. The ITO material is transparent in the infrared and visible spectral energy but becomes increasingly absorptive as wavelength is decreased into the ultraviolet spectrum.

The p-i-n photodiode structure is designed to collect positive charges (holes) at the pixel pad and electrons at the top ITO electrode. The quantum efficiency (QE) versus wavelength, and the absorption depth versus wavelength, for a-Si:H are displayed in FIG. 2 and FIG. 3. The a-Si:H photodiode has neglible photoresponse for wavelengths larger than 750 nm due to the 1.7 eV bandgap energy of the a-Si:H i-layer. The absorption depth of the i-layer grows quickly for photon energies that are smaller than the bandgap energy, and therefore becomes much larger than the i-layer thickness for wavelengths larger than 750 nm.

Microcrystalline Silicon Photodiode

Figure 4:
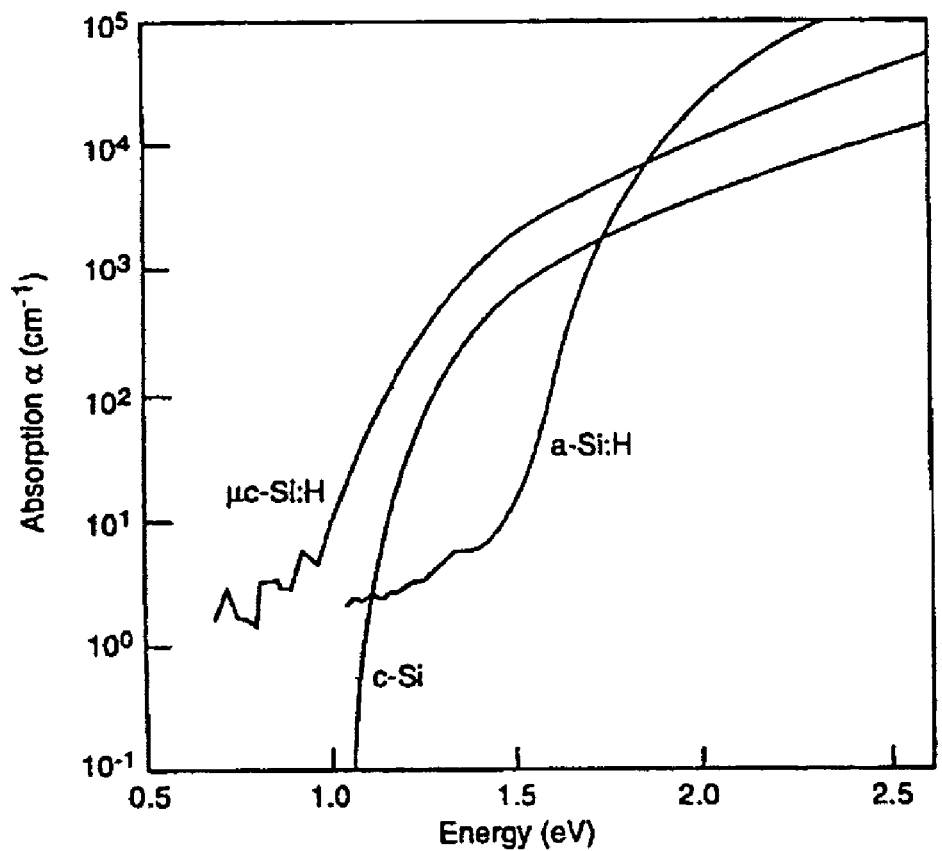
FIG. 4 shows the absorption coefficients versus wavelength for amorphous silicon, crystalline silicon, and microcrystalline silicon.

In order to extend the photoresponse to wavelengths larger than 750 nm, a microcrystalline silicon i-layer can be substituted for the a-Si:H i-layer. Amorphous silicon has a 1.7 eV bandgap which limits photoresponse for wavelengths above 750 nm. In contrast, crystalline silicon has a bandgap of 1.1 eV which permits photon detection to 1100 nm wavelengths. Microcrystalline silicon can have an effective bandgap anywhere in the range of 1.7 eV to 1.1 eV, depending on the degree of crystallinity. FIG. 4 shows microcrystalline silicon can even absorb photons with energies below the 1.1 ev band-gap energy of crystalline silicon. Therefore, the substitution of μc-Si for a-Si in the i-layer enables photoresponse to wavelengths slightly beyond 1100 nm. The reduction in band gap occurs because of a continuous change in character, from amorphous silicon to crystalline silicon as the degree of crystallinity increases. Concurrently, the absorption coefficient decreases with increasing crystallinity as the material transitions from the direct band gap of amorphous silicon to the indirect band gap of crystalline silicon. However, the absorption depth of μc-Si remains significantly larger than crystalline silicon over the entire absorption range.

The microcrystalline i-layer also features a photoresponse time constant that is substantially faster than amorphous silicon due to the increased mobility of the charge carriers in microcrystalline silicon. When a light signal is removed from an amorphous silicon photodiode structure, the response of the photodiode does not instantaneously drop to zero. Rather, there is a decay in the signal with a time constant on the order of 100-300 microseconds. This time constant is unnoticeable for 30 Hz video sensors with a 33 millisecond integration time per frame. However, this time constant does limit the extension of this sensor technology to faster frame rates, such as 1 kHz frame rate sensors, for example. Due to the lower density of states in the more orderly microcrystalline materials, the time constant for this decay could be reduced to as low as 1 microsecond.

Sensors with microcrystalline silicon photoconductor layers covering active pixels have several distinct advantages over traditional crystalline silicon sensors. One advantage is that the photo-detector is grown as a continuous film on the surface of a CMOS readout array so that the entire surface area of the imaging array is utilized for light detection, resulting in a 100% fill factor. The second advantage arises as a result of the absorption coefficient of µc-Si as compared to crystalline silicon. As shown in FIG. 4, the absorption coefficient of µc-Si is significantly higher than crystalline silicon over the entire absorption range. Additionally, the absorption of µc-Si extends slightly farther into the infrared than crystalline silicon. The third advantage arises as a result of using a p-i-n or n-i-p diode structure instead of the p-n structure used in prior art crystalline silicon devices. In a crystalline silicon p-n diode, the silicon wafer is used as the absorbing layer of the photo-detector. In this configuration, the electric field is generated at the p-n interface, and as stated above, only extends about a micron into the crystalline silicon diode. Infrared light penetrates tens of microns into the crystalline silicon. At this depth, there is no electric field to assist in collection. As a result, diffusion is relied on for collection. With no field, the charges when generated will randomly diffuse in all directions. This results in the loss of the half of the charges that drift downward, away from the electronics. Of the remaining charges, only a few will drift directly upward to the pixel into which the light entered. The remaining charges will either recombine or will migrate into adjacent pixels, resulting in significant cross talk. As a result the pixel in this type of infrared sensor must be kept sufficiently large to keep cross talk under control. In contrast, in the p-i-n or n-i-p device, the electric field is applied across the i-layer. This develops a vertical field across the i-layer that causes virtually all substantial charges generated in the i-layer to drift and be collected in pixel in which they were generated. This allows use of much smaller pixels.

A review of the literature shows that µc-Si is very promising for use in these structures. Sensitivity to 1-micron wavelength and beyond has been reported by many groups. The µc-Si layer can be grown by several methods, however the use of RF PECVD is directly compatible with current processing and so is Applicants' preferred method.

Figure 5:
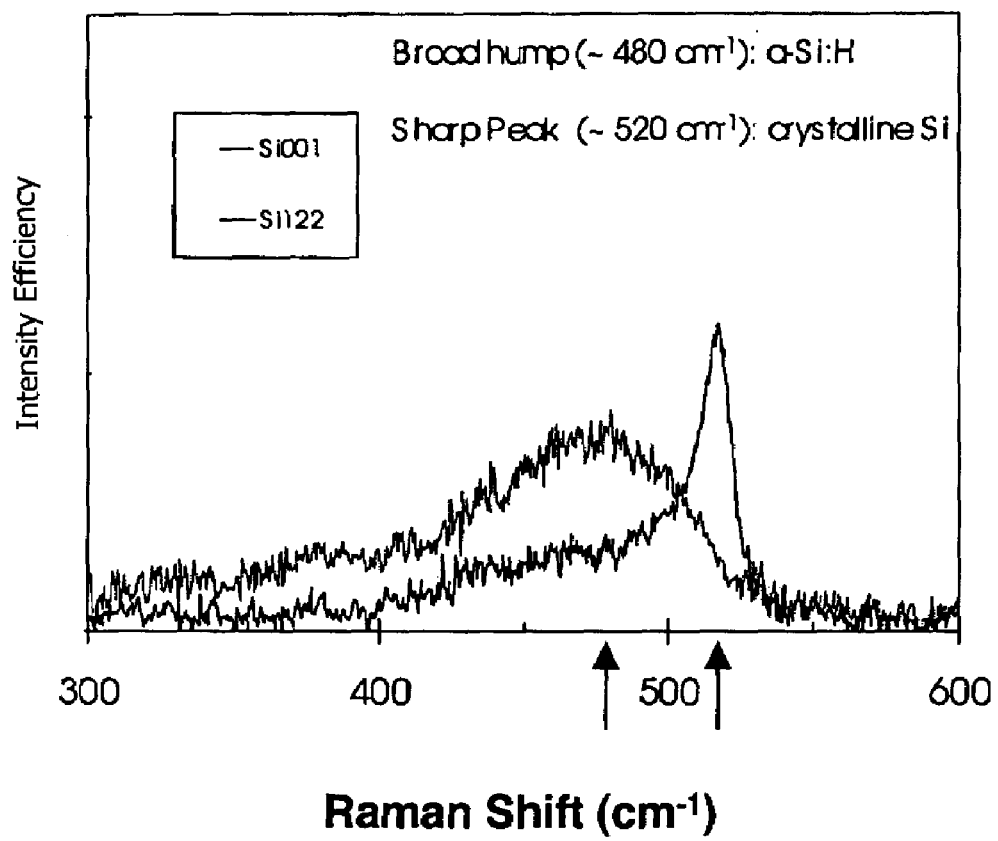
FIG. 5 shows the Raman growth demonstrating microcrystalline growth by PECVD.
Figure 6:
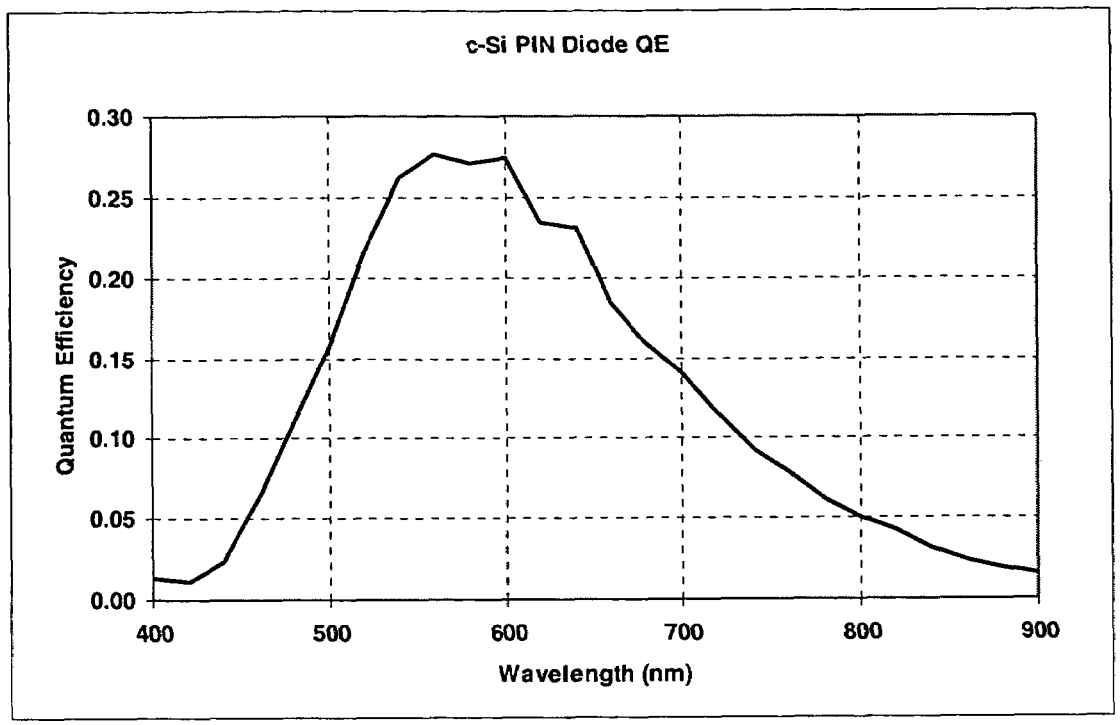
FIG. 6 shows the measured QE versus wavelength data for a microcrystalline silicon photodiode structure.

Internal research conducted by Applicants has confirmed the shift in the absorption spectrum of µc-Si as compared to a-Si microcrystalline silicon photodiode structure. The absorption spectrum of the layers are compared in FIG. 5. After development of a µc-Si i-layer, a full p-i-n photodiode structure was fabricated by Applicants and their fellow workers. The quantum efficiency as a function of wavelength for this device is shown in FIG. 6.

Microcrystalline Copper Indium Diselenide

Figure 2:
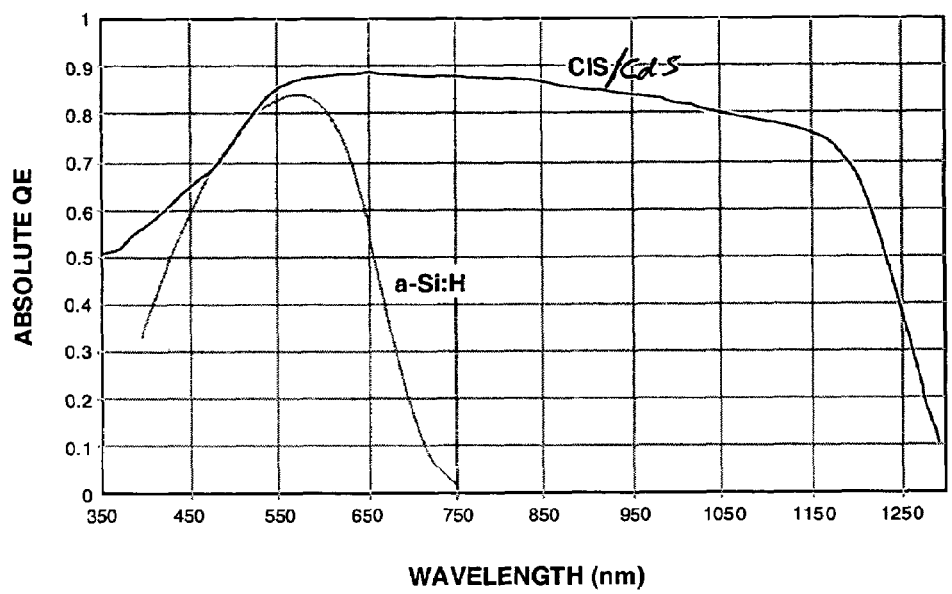
FIG. 2 shows the quantum efficiency versus wavelength of amorphous silicon (a-Si:H) and copper indium diselenide (CIS).
Figure 3:
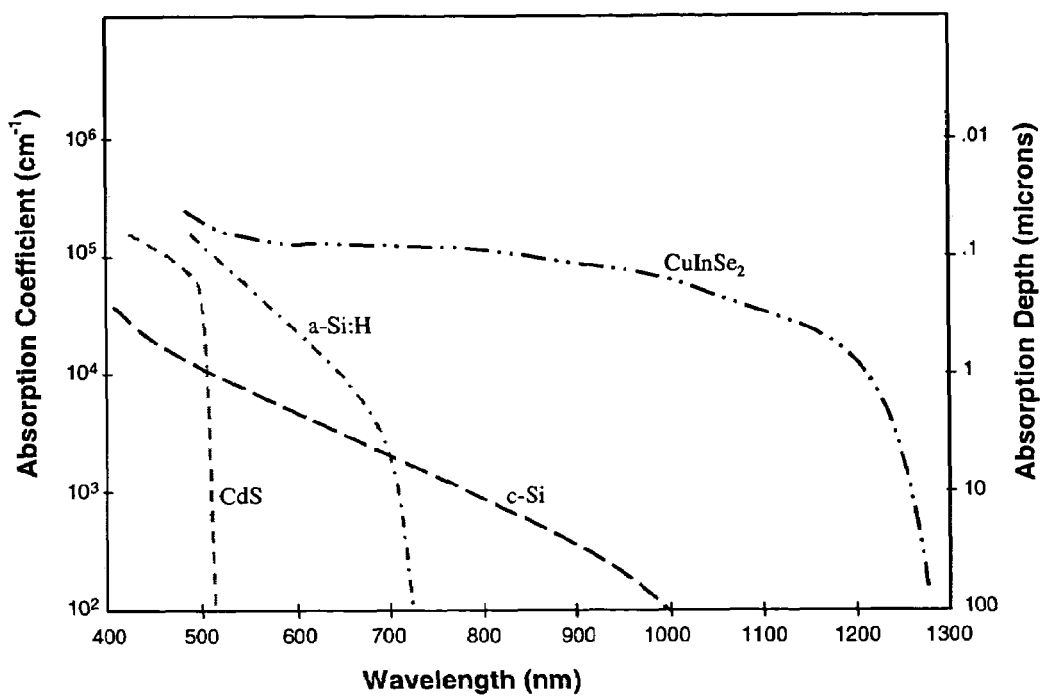
FIG. 3 shows the absorption coefficient and absorption depth for amorphous silicon (a-Si:H), crystalline silicon (c-Si), copper indium diselenide (CIS), and cadmium sulfide (CdS).

Another preferred embodiment of the present invention for a near infrared image sensor is a copper indium diselenide/cadmium sulfide (CIS/CdS) photodiode structure. FIG. 2 shows that the photo-response of this photodiode structure extends over the visible spectrum into the near infrared spectrum. The development of CIS/CdS photodiode structure by the solar cell industry has led to a technology with the highest power conversion efficiency to date, primarily because the sensitivity of this structure spans a much wider range of the solar spectrum (350 nm-1250 nm).

A preferred method for fabricating a CIS/CdS photodiode structure first involves the deposition of a copper indium gallium diselenide (CIGS) layer. This layer is preferably about 1-2 microns thick and is deposited using a four crucible evaporative coating process. Each of the four crucibles contains one of the four constituent elements and is elevated to a temperature to produce a vapor pressure of the constituents to provide the correct stoichiometric ratio in the CIGS layer. The preferred stoichiometric ratios are 22-24% Cu, 50% Se, and the balance being In and Ga with a Ga/In plus Ga ratio of 0.2 to 0.3. The preferred substrate temperature is 400-450 degrees C.; this temperature is lower than the conventional 550 degrees C. substrate temperature used for solar cell fabrication, in order to protect the CMOS cell readout array from thermal damage. The properly deposited CIGS layer acts as a p-doped semiconductor. A p-n photodiode is fabricated by depositing a cadmium sulfide (CdS) n-layer. The preferred method for fabricating the CdS layer involves a chemical bath. An alternate fabrication method involves the sputtering of a cadmium sulfide target onto the CIGS layer. The CdS layer is preferably 500 to 1000 angstroms thick. The CdS layer is highly transparent to incident photons in the 400 to 1300 nm spectral range, as shown by the absorption coefficient chart in FIG. 3, thus enabling efficient transmission of incident photons to the photodiode depletion region.

Crystalline and Microcrystalline Germanium and Silicon Germanium

The near infrared (NIR) performance of microcrystalline silicon photodiode sensors can further be enhanced by alloying with germanium. Crystalline germanium has an indirect band gap of 0.67 eV that corresponds to a wavelength of about 1.8 microns. For a high degree of crystallinity, the bandgap of a µc-SiGe alloy would then vary from 1.1 eV to 0.67 eV as the germanium content is increased from 0% to 100%. Furthermore, the optical absorption coefficient of germanium is nearly an order of magnitude higher than silicon, thus a µc-SiGe alloy with a high germanium content would be significantly more absorbing in the NIR regime than µc-Si alone.

Figure 10:
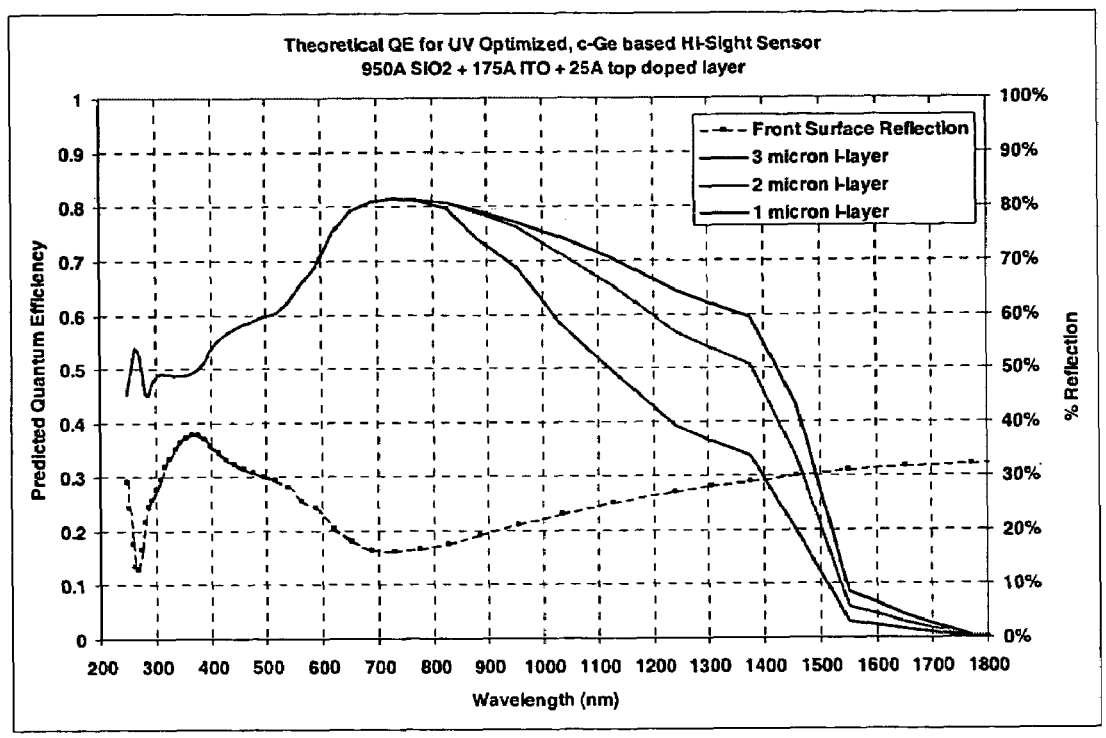
FIG. 10 shows the calculated quantum efficiency versus wavelength of microcrystalline germanium (μc-Ge) for three different i-layer thicknesses.
Figure 10A:
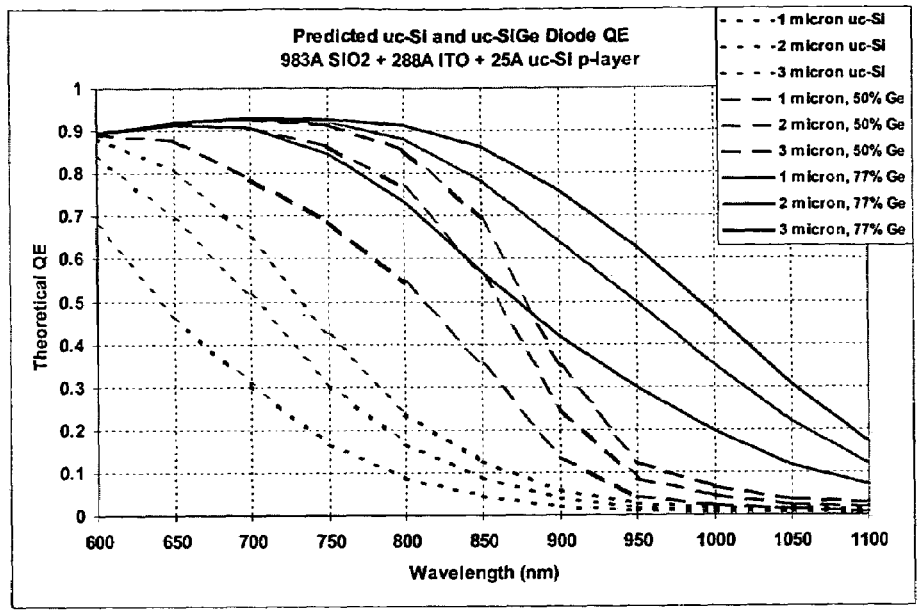
FIG. 10A shows the predicted QE curves for photodiodes based on μc-Si, μc-$Si_{0.5}Ge_{0.5}$, and μc-$Si_{0.23}Ge_{0.77}$ i-layers.

Silicon and germanium are miscible and have very similar lattice constants. They also both appear in the same column of the periodic table and so electrically behave very similarly. A µc-SiGe alloy can then be fabricated with anywhere from 0% to 100% germanium. FIG. 10A shows the increasing NIR response with increasing germanium content. This increase in response occurs for two distinct and important reasons. First, as the germanium content of the alloy increases, the effective band gap of the resulting alloy shifts from 1.1 eV at 0% to 0.7 eV at 100%. Second, germanium has a nearly direct band gap, which results in a significantly higher absorption coefficient as compared to µc-Si. Thus as the germanium content increases, so does the effective absorption coefficient. Extending this approach to its logical conclusion, the use of a purely µc-Ge photodiode structure should then maximize both absorption and wavelength range.

Nearly all published work on silicon-germanium based devices comes from thin film photovoltaic research. This community is primarily interested in increasing the net efficiency of thin film solar cells. Alloying of silicon and germanium is performed primarily for optimization of the bottom cell in tandem, multi-junction, solar cell devices where there is little need to have a band gap below 1.0 eV. Therefore there is very little existing data regarding purely µc-Ge photodiodes and material properties. The limited data that is available for the absorption of µc-Ge in the NIR shows that it is higher than that of c-Ge. This behavior is similar to the enhanced absorption of µc-Si as compared to c-Si. Optical data is required over the entire range from UV to NIR for the modeling of the QE performance of a μc-Ge photodiode. Since data is only available for a portion of this range, Applicants have used the optical properties of crystalline germanium (c-Ge) in their models. Since the NIR absorption of μc-Ge is higher than c-Ge, the predicted performance by our model then represents a lower limit to the NIR QE performance of an actual μc-Ge photodiode. Actual QE performance to 1.8 microns can be significantly higher than what is predicted by this model.

Figure 10B:
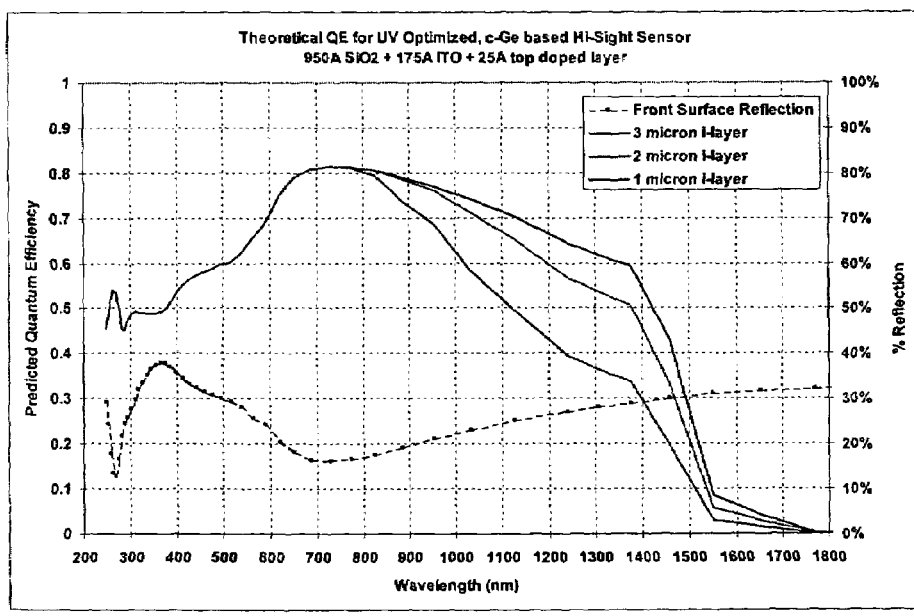
FIG. 10B shows the predicted performance for a μc-Ge photodiode using c-Ge optical properties as discussed above.

FIG. 10B shows the predicted performance for a μc-Ge photodiode using c-Ge optical properties as discussed above. The $SiO_2$ antireflective coating and the indium tin oxide top electrode were simultaneously optimized to maximize response in the 250 nm to 300 nm range. A 25Å μc-Ge top doped layer was assumed for parasitic absorption calculation. The chart shows significant response from 250 nm to 1600 nm with IR response increasing with increasing absorber layer thickness. A maximum practical thickness of ~3 microns is reasonable to expect. Of note is that this structure is predicted to have near 50% QE over the range of 250 nm to 300 nm, greater than 70% QE at 1060 nm and about 30% QE at 1500 nm, assuming a 3 micron layer. The IR performance for actual μc-Ge could be even higher, with very significant response extending all the way to 1800 nm.

Germanium Deposition Methods

First Preferred Method

Microcrystalline germanium (μc-Ge) can be deposited onto a substrate via continuous wave, rf plasma enhanced chemical vapor deposition (PECVD). This deposition technique consists of a high vacuum or an ultra high vacuum chamber equipped with capacitively coupled, parallel plate electrodes spaced 1 to 5 cm apart. The substrate is mounted to either the grounded or the powered electrode, with the grounded electrode configuration more typical. The substrate temperature is maintained in the range of 100 to 300 C. A standard 13.56 MHz rf generator and matching network supply the power for generation of the plasma. For an extrinsically undoped germanium film, $GeH_4$ and $H_2$ feedstock gasses are mixed in the range of 10:1 to 100:1 $H_2$ to $GeH_4$, regulated by means of mass flow controllers. The gases are introduced to the vacuum chamber at a fixed total flow rate and the total chamber pressure is regulated in the range of 0.1 to 10 Torr. A conventional continuous wave, rf plasma is activated between the electrodes to initiate dissociation of the feedstock gasses into reactive species. Once the gasses are broken down, the resulting radicals react at all exposed surfaces, resulting in film growth. For a given total pressure and gas mixture, the growth rate is controlled by regulation of the total plasma power, which can cover the range of 5 to 500 mW per square centimeter of electrode area. Increasing the plasma power increases the deposition rate. The maximum deposition rate is limited by the polymerization of reactive species in the gas phase, resulting in the formation of particulates, or dust. Doping of the μc-Ge film is accomplished by the addition of diborane ($B_2H_6$) or phosphene ($PH_3$) to the feedstock gasses for p-type or n-type doping, respectively.

Second Preferred Method

Microcrystalline germanium may also be deposited onto a substrate via pulse modulated, RF PECVD. The technique is basically the same as that described above except the rf output is modulated by a square wave with a frequency in the range of 10 to 100 KHz and a duty cycle of 10 to 50%. For a given total pressure and gas mixture, the growth rate is controlled by regulation of the total plasma power, which can cover the range of 50 to 1000 mW per square centimeter of electrode area. Increasing the plasma power increases the deposition rate. In the continuous wave application, the maximum deposition rate is limited by the polymerization of reactive species in the gas phase, resulting in the formation of particulates, or dust. The utilization of pulsed modulation allows increased deposition rates by providing a means to remove nucleation sites for dust formation. Negatively charged ions are formed and become trapped in the plasma. These negative particles become the nucleation sites for particulate growth. Modulation of the RF power provides breaks in the plasma during which the negative ions can be swept out of the chamber with the gas flow. This suppresses powder formation and thus the limitation to higher deposition rates is removed. Doping of the μc-Ge film is accomplished by the addition of diborane ($B_2H_6$) or phosphene ($PH_3$) to the feedstock gasses for p-type or n-type doping, respectively.

The pulse modulated plasma technique has been demonstrated to be effective for the growth of both amorphous and microcrystalline silicon thin films. The typical deposition rate for continuous wave RF PECVD deposited, device quality amorphous silicon is approximately 1-2 Å/s. Use of pulse modulated plasma deposition has resulted in deposition rates of greater than 7 Å/s for device quality films[1]. Similarly, device quality microcrystalline silicon is typically deposited at a rate of less than 1 Å/s in a continuous wave plasma while use of a pulse modulated plasma can increase the deposition rate to greater than 1 Å/s, with 1.2 Å/s being reported[2]. The plasma chemistry of $GeH_4$ is similar to that of $SiH_4$, therefore similar behavior is expected. Additional details concerning these two techniques are provided in the following references: (1) S. Morrison, A. Madan; Deposition of Amorphous Silicon Solar Cells via the Pulsed Plasma PECVD Technique; 28th IEEE PVSC, Anchorage, Sep. 15-22, 2000, and (2) S. Morrison, U. Das, A. Madan; Deposition of Microcrystalline Silicon Films and Solar Cells via the Pulsed PECVD Technique; 29th IEEE PVSC, New Orleans, May 20-24, 2002.

Enhanced Ultraviolet and Infrared Response

Thickness Issues

Preferred embodiments of the present invention contain improvements to achieve light sensing capability over the range of 290 nm to 1060 nm. For such devices, the quantum efficiencies at 290 nm can be as great as 50% while still allowing highly efficient visible collection and QE values and as high as 7% at 900 nm. Higher near infrared QE can be achieved with thicker i-layers, however there are practical limitations on maximum thickness that include deposition process limitations as well as collection limitations due to carrier mobility-lifetime. Based on reported solar cell i-layer thicknesses in the literature, the practical limitation appears to be in the range of 3-5 microns. The fabrication of a complete multi-spectral imaging sensor would then simply require application of this broadband coating to an appropriately designed CMOS imaging array. For compatibility with the n-i-p device structure, the CMOS array would be required to collect electrons. Further improvement of the quantum efficiency and extension of the spectral response to 1060 nm can be achieved by further optimization of the microcrystalline photodiode process. Applicants' theoretical analysis indicates that 22% QE at 1060 nm can be achieved.

Reduced Reflectance

An optical model has been generated to predict the quantum efficiency of a device that incorporates all of these proposed modifications to the Photodiode On Active Pixel (POAP) process. The index of refraction and the absorption coefficient as a function of wavelength of the μc-Si i-layer are extracted from published data. The top contact/antireflective coating is a bi-layer with a continuous ITO film in contact with the p-layer and a continuous $SiO_2$ layer deposited onto the ITO. The preferred embodiment optimizes the thicknesses of both layers to allow maximum transmission into the i-layer via constructive interference at a wavelength of 290 nm.

An alternate embodiment utilizes a patterned conductive grid for use as the top electrode of the sensor array. The grid "wires" cover the perimeter of each pixel, while leaving the center open. The intent for this structure is to avoid the parasitic absorption of ultraviolet light by the top electrode. The choice of material for the top electrode is of practical importance, since photolithography will be necessary to pattern the layer so that it covers only the perimeters of the 5 micron pixels. The etchant required for the chosen top electrode material must be compatible with the underlying photodiode structure. Even a small amount of etching of the top silicon layer could render the device inoperable. Therefore, the grid approach requires that the materials chosen for the layers must not only allow for broadband transmission of light into the sensor, but it must also be compatible with the etching properties.

The ultraviolet response of an amorphous or microcrystalline n-i-p photodiode is primarily limited by the ability of the incident light to penetrate into the i-layer where it can be collected. The causes of this limitation are front surface reflection and parasitic absorption in the top ITO layer and n-layer. In addition, further losses are associated with the collection of the charge pairs, once they are generated. Ultraviolet light is absorbed very close to the front surface of the i-layer adjacent to the n-layer. The minus charge is collected at the n-layer and, thus, has a very short distance to traverse. However, the plus charge must pass through the entire thickness of the i-layer before it can be collected at the p-layer. This can result in very significant recombination losses. The plus charges are the minority carrier in the photodiode and have a mobility-lifetime product that is approximately one order of magnitude smaller than electrons. These losses become more serious with increased i-layer thickness and decreased electric field strength.

Optical Model

An optical model was developed for up to three absorbing thin film layers of arbitrary thickness on an absorbing substrate. The absorbing substrate represents the i-layer, while the three overlying layers represent the top doped layer and a bi-layer antireflection coating. The anti-reflecting coating may include the ITO layer, depending on the configuration. The optical properties of several potential anti-reflecting coatings were compiled from the literature for use in this calculation. These include $MgF_2$, $HfO_2$, $Al_2O_3$, $Ta_2O_5$, $YF_3$, $Y_2O_3$, $SiO_2$, $ZrO_2$, and ITO. Other materials that were investigated were too strongly absorbing in the ultraviolet regime to be useful. The optical properties of amorphous and microcrystalline silicon were also compiled from the literature to complete the model. For any given set of layers, the thicknesses were optimized to maximize the UV transmission into the i-layer.

Reversing the photodiode structure from that shown in FIG. 1A so that the p-layer is adjacent to the top electrode will allow the positive charges to be collected on the top electrode adjacent to where they are generated for ultraviolet photons. The negative charges generated in the i-layer are then collected on the pixel electrodes and migrate to the pixel capacitors. This will minimize electrical losses for ultraviolet detection while still allowing the use of a thick i-layer for efficient near infrared absorption. Use of an n-i-p structure will allow sensitivity to UV and NIR radiation to be substantially decoupled, so that they can be independently optimized.

The anti-reflecting coating optimizations were performed for a photodiode structure with both a μc-Si i-layer and top doped layer. The thickness of the top doped layer was limited to a minimum of ~25Å, as below this thickness the diode performance begins to suffer due to poor junction properties. For the regions between a top electrode grid, where the ITO is removed, the best bi-layer AR coatings were found to be $MgF_2+HfO_2$, $MgF_2+Ta_2O_5$, $SiO_2+HfO_2$, and $SiO_2+Ta_2O_5$.

Figure 11:
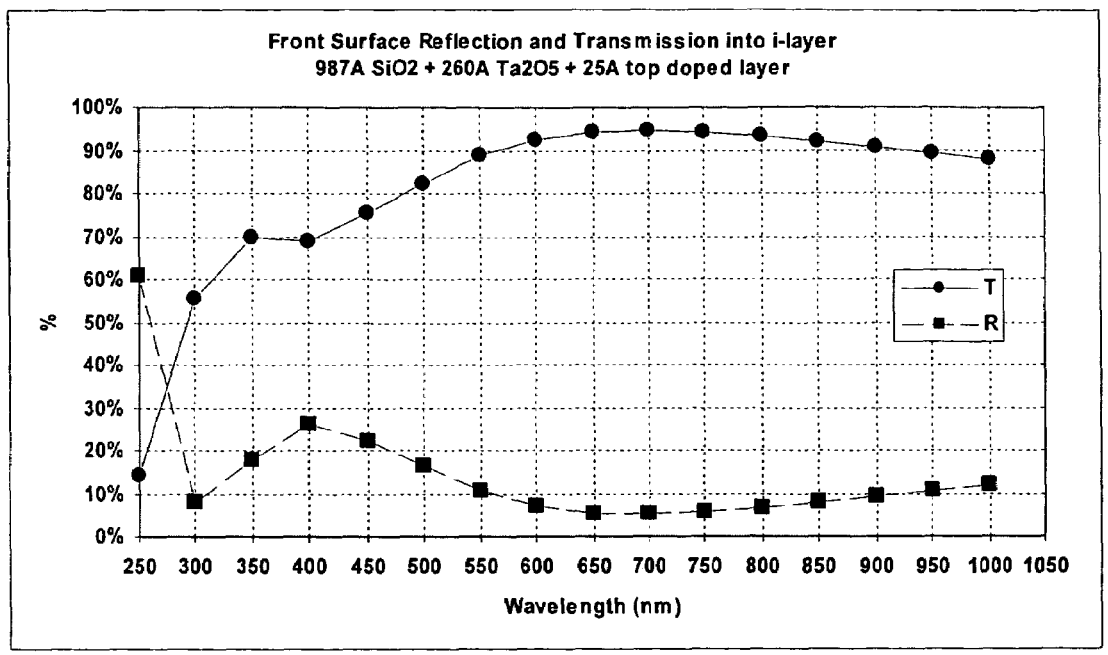
FIG. 11 shows front surface reflection and transmission of light into the i-layer in a μc-Si device with an optimized $SiO_2+Ta_2O_5$ anti-reflection coating.

Coating materials preferably should not only meet the optical requirements, but the material should also be etchable using etchants compatible with CMOS fabrication process. An etch step is necessary in order to expose the wire-bond pads on the CMOS sensor after all deposition steps are completed. This requirement eliminates $MgF_2$ from consideration, as no suitable etchant was found for this material. The same is true of $HfO_2$. The only remaining bi-layer is then $SiO_2+Ta_2O_5$. This bi-layer is compatible with CMOS processing. Both $SiO_2$ and $Ta_2O_5$ are soluble in HF. This allows for a simple, single-step wet etch of the bi-layer AR coating. FIG. 11 shows the reflection and transmission curves for the optimized AR coating bi-layer of 987Å $SiO_2$+281Å $Ta_2O_5$.

During the course of examining combinations of the above materials, the possibility of combining a single layer anti-reflecting coating with an ITO top conductive layer to form a bi-layer was also investigated. Considering the etch requirements discussed above, it was found that an optimized bi-layer of 983Å $SiO_2$+288Å ITO was the most suitable combination. Interestingly, this bi-layer delivers nearly identical performance at 290 nm as the $SiO_2+Ta_2O_5$ bi-layer AR coating without ITO. This then implies that the top contact grid pattern may not necessary for detection to 290 nm ultraviolet light.

Grid Effects on the Internal Electric Field

First, consider the case of continuous top and bottom electrodes. For this configuration, the potential is simply $$\phi(x, y) = \frac{\phi_{ITO}}{t} \cdot y$$

Figure 12A:
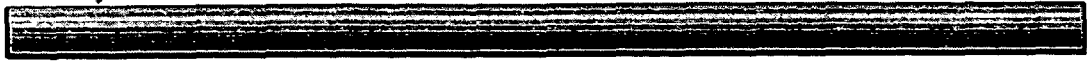
FIG. 12A-12E show equipotential plots for continuous (12A) top and bottom electrodes, as well as strip (12B-12E) electrodes with aspect ratios ranging from t=0.1 to 0.6.
Figure 12B:
Figure 12C:
Figure 12D:
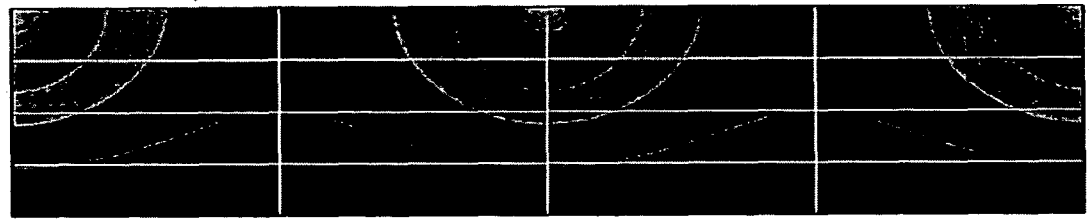
Figure 12E:
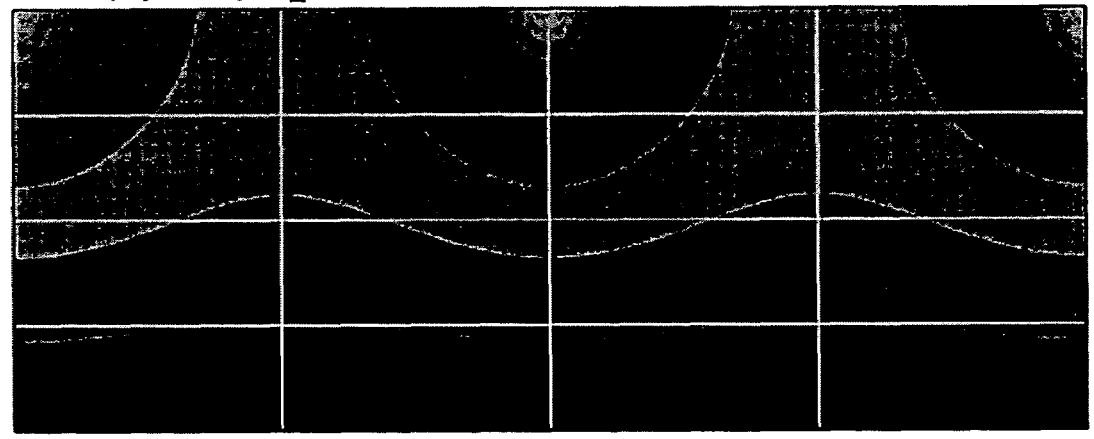

The voltage on the ITO is arbitrary, so it will be chosen to be 1 for this analysis. The equipotential plot is shown in FIG. 12a. The effects of a top electrode grid will be considered next for comparison.

The analysis is performed for a two-dimensional case with periodic strip electrodes representing the ITO grid at a distance t above an infinite grounded plane representing the back contact. The strips are located at x=m, where m=0, 1, 2 . . . This simplified configuration was chosen to allow the calculation of an analytic solution that can provide some insight into the field behavior in the actual device.

It is first assumed that there is no net build up of charge in the i-layer. In this case the potential is governed by Laplace's equation, $$\nabla^2 \phi(x,y)=0$$

The solutions to Laplace's equation in Cartesian coordinates are a linear combination of the following solutions, $$\phi(x, y) = \begin{cases} e^{ky}\sin(kx) \\ e^{-ky}\sin(kx) \\ e^{ky}\cos(kx) \\ e^{-ky}\cos(kx) \end{cases}$$

For a strip electrode at x=0, y=t, the solutions involving the sin(kx) term are not feasible. The solution is then a linear combination of the remaining terms. These can be arranged in any order, so that they reduce to a linear combination of the following two solutions.

$\cos(kx)\cdot(e^{ky}+e^{-ky})$, and $\cos(kx)\cdot(e^{ky}-e^{-ky})$

The exponentials can now be converted as follows, $\cos(kx)\cdot(e^{ky}+e^{-ky})=2\cdot\cos(kx)\cosh(ky)$, and $\cos(kx)\cdot(e^{ky}-e^{-ky})=2\cdot\cos(kx)\sinh(ky)$ Of these, the cosh(ky) solution does not meet the boundary condition of $\phi(x,0)=0$. Next, the required periodicity of the solution specifies k=2π·n, where n=0, 1, 2 . . . Lastly, to consider all possible linear combinations of the remaining solutions, an infinite series is constructed.

$$\phi(x, y) = \phi_0 \cdot y + \sum_{n=1}^{\infty} \phi_n \cos(2\pi \cdot nx)\sinh(2\pi \cdot ny)$$

At y=t, the y component of the electric field, $E_y$, is a delta function. The electric field is just the gradient of the potential, so that the y component is $$E_y = \frac{\partial}{\partial y}\phi(x, y),$$

This imposes a further boundary condition on the solution, which leads to $$\phi_0 = 1, \text{ and}$$

$$\phi_n = \frac{1}{2\pi \cdot n \cdot \cosh(2\pi \cdot nt)}.$$

In this solution, the x-axis period of the top electrode strips is 1 and the distance between the top and bottom electrodes is t. This makes the aspect ratio of thickness/pixel pitch equal to t. For realistic devices, the pixel pitch is 5 microns and the thickness is anywhere from 0.5 micron to as much as 5 microns. This is then equivalent to solutions for 0.1<t<1. Equipotential plots are shown in FIGS. 12b-12e for various aspect ratios.

Based on the theoretical analysis, the electric field should be greatly reduced between the top electrodes if there is an infinitely resistive material between them. This however represents a worst-case scenario, as the layer in contact with the ITO grid is a doped layer of the a-Si photodiode. It is the n-layer in the case of a n-i-p diode or the p-layer in the case of the p-i-n diode. If the conductivity of the top doped layer were varied from very conductive to very resistive, the field would also vary from the continuous top contact case to the strip contact case.

Another observation is that the effects of the top electrode grid become less severe as the i-layer thickness is increased. This makes intuitive sense since the grid looks more and more like a continuous layer as the distance from it is increased.

The above analysis gives a good qualitative picture of the effects of using a top electrode grid on the internal electric field of a n-i-p or p-i-n photodiode. In conjunction with the simple continuous top contact model, it also provides a picture of the two extremes of using either a very conductive or a very resistive top doped layer in conjunction with the top electrode grid. Lastly, it demonstrates the effects of i-layer thickness on the internal electric field behavior. All of these qualitative insights are very useful for predicting the expected trends in behavior for a real device. However, a quantitative theoretical analysis of a realistic device would be necessary to predict actual device performance with any accuracy. An analysis of this type would require a far more complex and sophisticated model. The finite line widths of the top electrode grid would have to be accounted for in a 3-dimensional model. In the treatment above, the top contact strips were considered to be infinitely thin. Also the effects of a top doped layer of finite resistivity would also have to be considered, whereas just the end points were considered above. Furthermore, the electric fields within the i-layer of the diode are far more complex than represented here. Even with continuous top and bottom contacts, the field is very strong at the p-i and i-n junctions and is considerably weaker within the i-layer. For these reasons, the quantitative effects of the top contact grid on performance can be more directly and confidently assessed by fabrication and testing of the actual device structure. The results of this analysis are discussed below.

In order to examine the effects of a top contact grid on the performance of a-Si photodiodes, both n-i-p and p-i-n devices were fabricated on 8 inch, TiN coated wafers. Three ITO top contact grid variations and a continuous ITO top contact were investigated. A pitch of 5 microns was chosen for the layout of each grid to maintain a direct relevance to the sensors, which at present have a pixel pitch of 5 microns. The drawn line widths were chosen to be 0.6, 1.0, and 1.5 microns for each grid type, respectively. The a-Si n-i-p and p-i-n diodes were grown in a plasma enhanced chemical vapor deposition system. The i-layer thickness and top doped layer thickness and resistivity were varied. The ITO top contact material was deposited by means of reactive RF sputtering. The diodes and grid patterns were defined photolithographically and etched in a dilute HCl solution. The HCL etch is isotropic and so undercuts the mask leaving the line widths fractionally smaller than drawn. The comparison of the as-drawn dimensions to the actual measured dimensions is found in Table 1. The photoresist was then stripped and the wafers were diced into 1 inch by 1 inch test plates. Each test plate contained four, 0.25 cm² diodes, one of each type. (FIG. 10) This process allowed for the fabrication of 37 diode plates per wafer.

TABLE 1

| Grid pattern | As Drawn line width | Measured line width | Pitch | f |
|---|---|---|---|---|
| 1 | 5.0 | 5.00 | 5.0 | 0.00 |
| 2 | 0.6 | 0.30 | 5.0 | 0.77 |
| 3 | 1.0 | 0.76 | 5.0 | 0.64 |
| 4 | 1.5 | 1.36 | 5.0 | 0.49 |

Figure 13A:
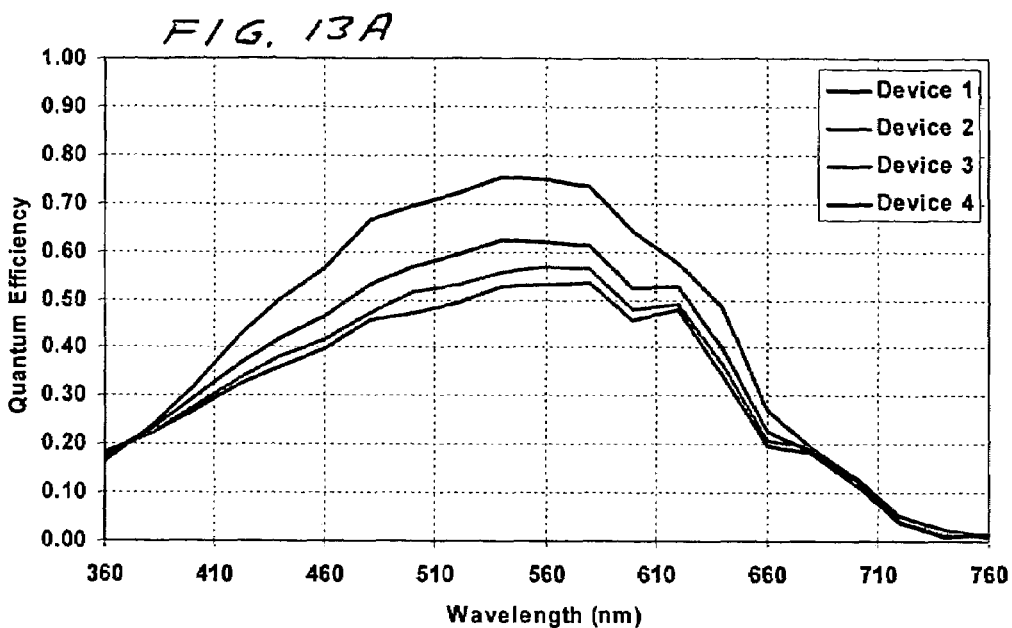
FIG. 13A-13F show measured quantum efficiency versus wavelength curves for various devices.
Figure 13B:
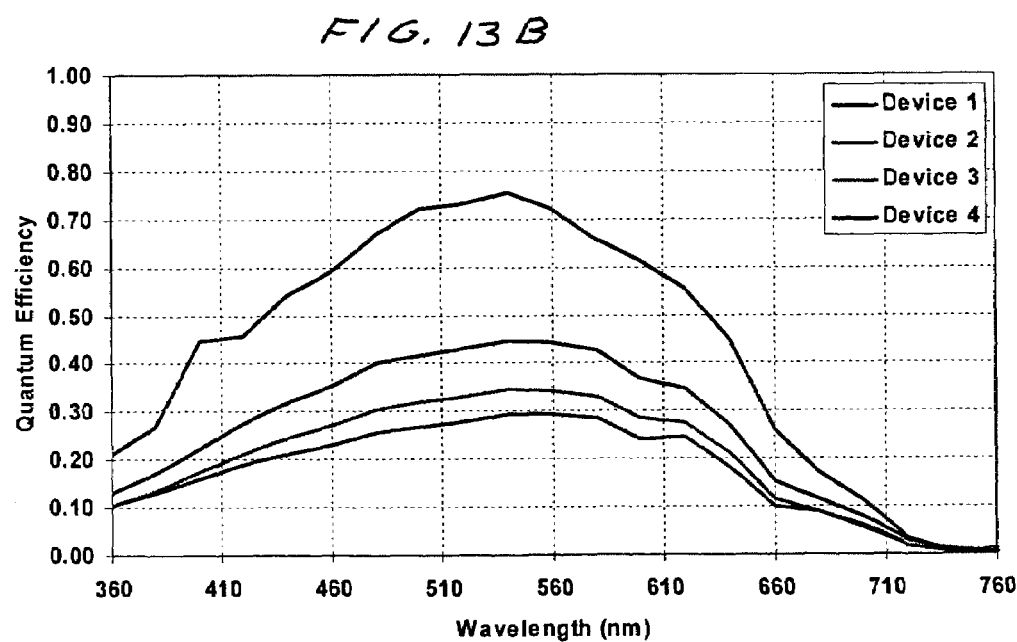
Figure 13C:
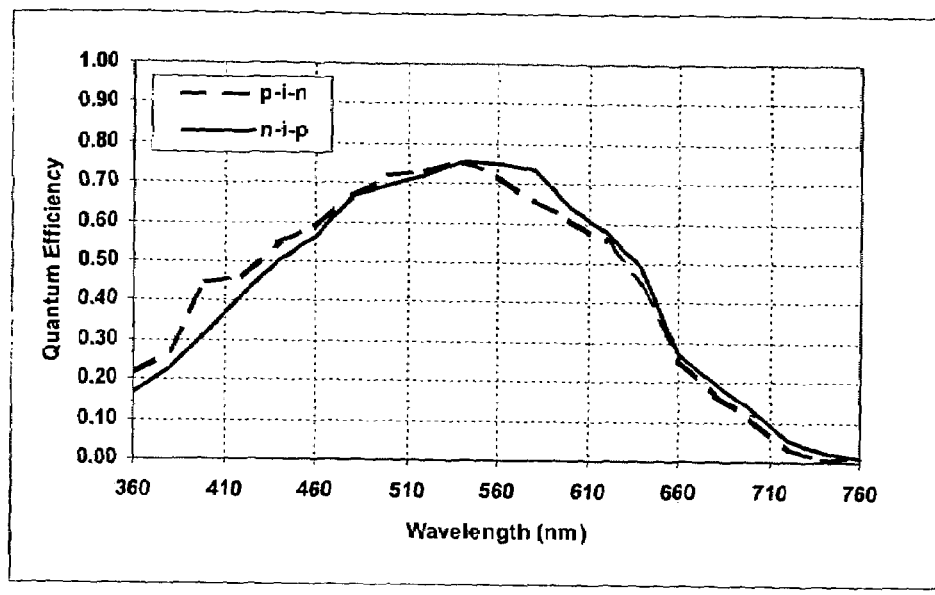

Quantum Efficiency (QE) versus wavelength was measured for each device over the range of 360 nm to 760 nm. Typical QE curves for each top contact type are shown for both n-i-p and p-i-n devices in FIGS. 13A and 13B, respectively. The first observation to be made is that the devices utilizing the grid pattern are operational. A second observation is that the blue response is significantly enhanced in the photodiode layers where the p-layer is adjacent to the top electrode. (See FIG. 13C) This is expected as the losses due to plus charge recombination are dramatically reduced when the negative charges make the long trip from near the top of the structure to the pixel electrodes.

Figure 13D:
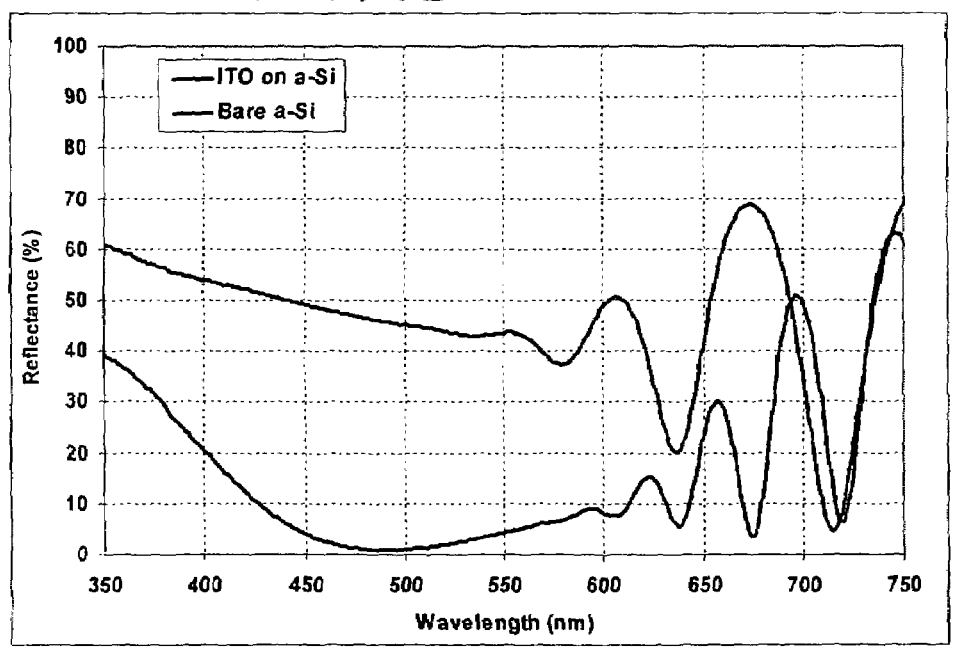
Figure 13E:
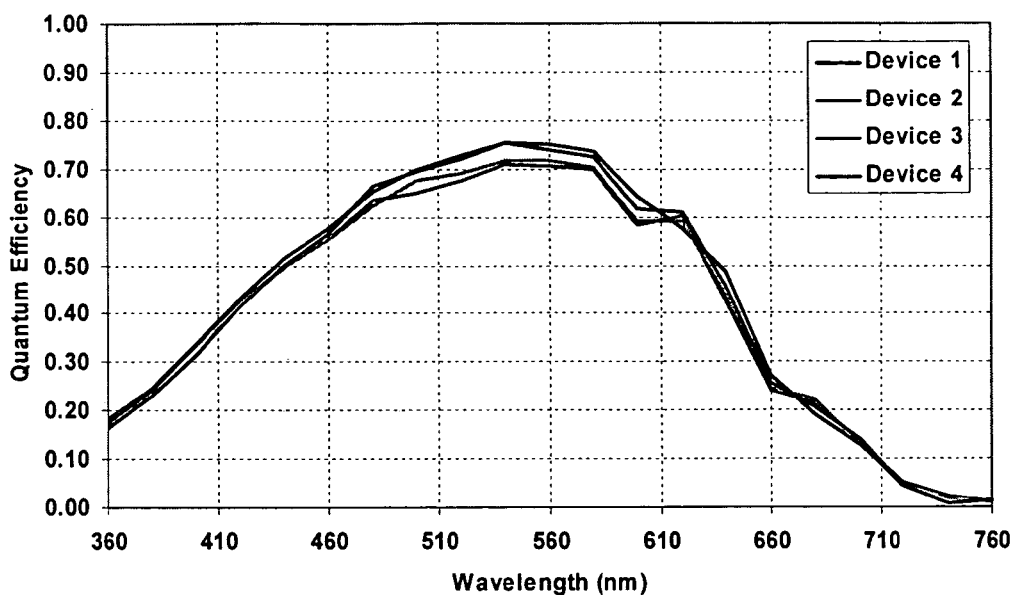
Figure 13F:
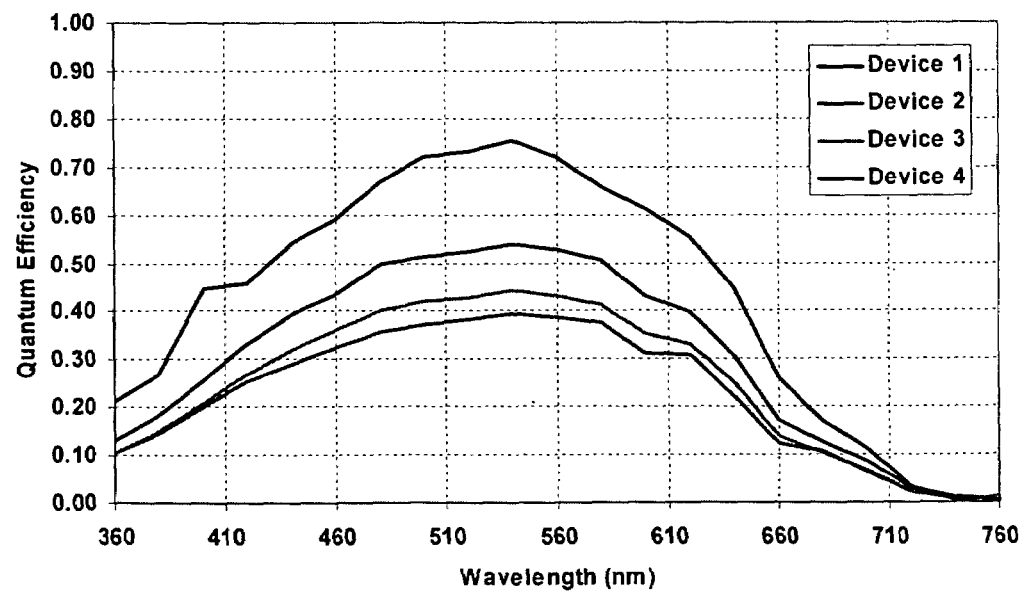

In both the p-i-n and the n-i-p structures the results appear progressively worse as the grid line width decreases. This is primarily due to the front surface reflection of the devices. The regions where the ITO has been removed have a much higher front surface reflection than the regions covered by the ITO. This is directly shown in the reflection plot in FIG. 13D. The fractional area of exposed silicon, f, increases significantly as the line width decreases as shown in Table 1. This effect must be accounted for to properly compare the performance of the various grids with the continuous ITO. FIGS. 13E and 13F show the front surface reflection corrected QE curves for the same devices as FIGS. 13A and 13B. It now becomes clear that the n-i-p devices show little to no loss as a result of using the top electrode grid. In contrast, the p-i-n device exhibits severe loss in performance even after removal of the front surface reflection effects. This can be understood as a consequence of the presence of a more resistive top doped layer in the p-i-n structure than in the n-i-p structure.

It is clear from the experimental results that the top electrode grid structure is a feasible approach, however losses due to weakened field strength are of concern. The effects of the top electrode grid on the electric field can be reduced when used in conjunction with a conductive top doped layer. However, based on the results of the AR coating analysis above, this issue can be avoided completely by use of a continuous ITO top contact in conjunction with a $SiO_2$ AR coating.

Use as a Night Vision Image Sensor

Figure 7:
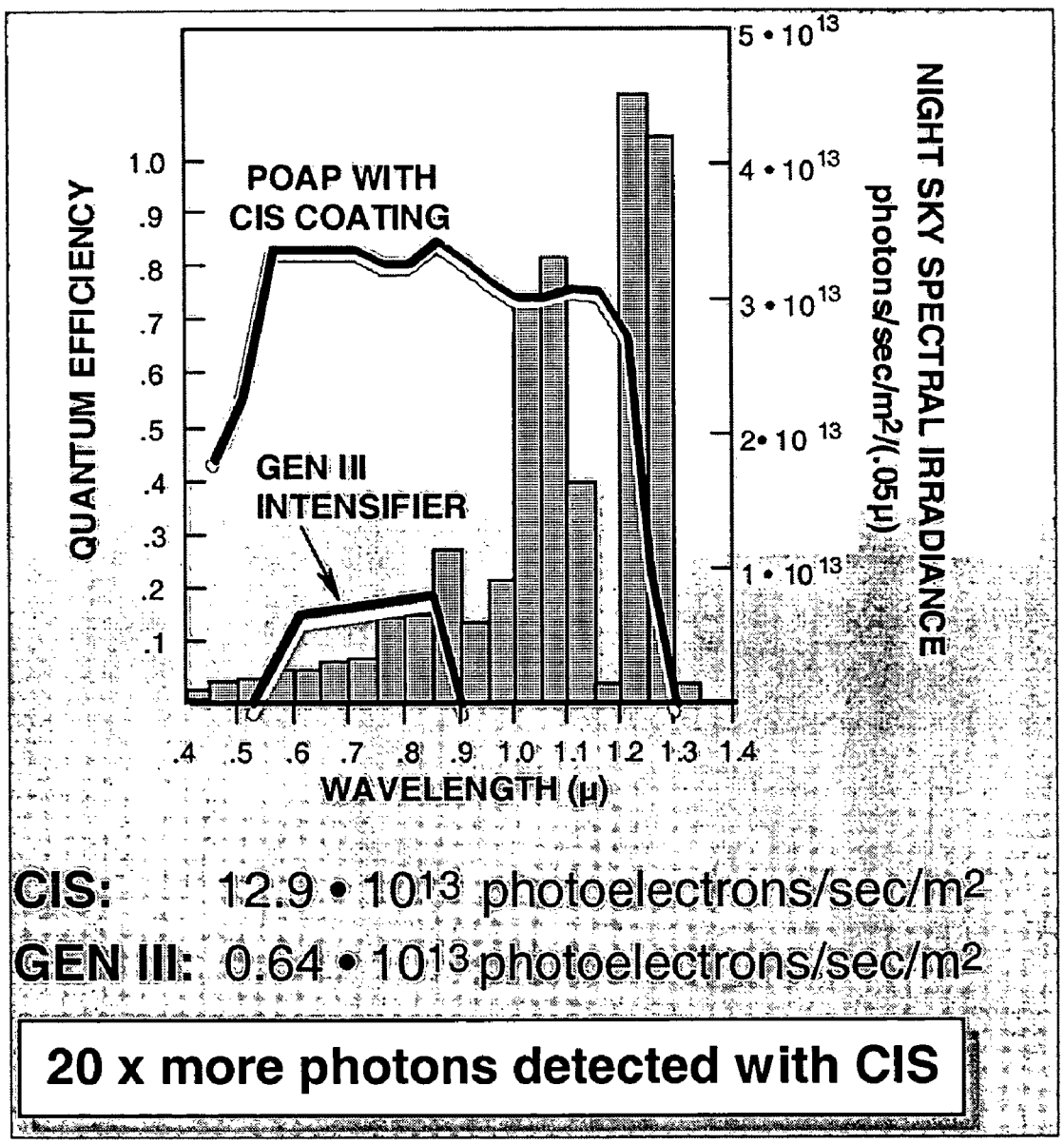
FIG. 7 shows the quantum efficiency versus wavelength of CIS and a GEN III image intensifier, in comparison to the night sky irradiance.

A photoconductor on active pixel image sensor that is coated with a CIS/CdS photodiode structure can compete favorably with night vision sensors, especially for moonless nights where starlight and atmospheric nightglow provide illumination. FIG. 7 displays that the quantum efficiency curve for the CIS/CdS image sensor greatly surpassed the quantum efficiency of the GEN III image intensifier sensor, especially in the near infrared spectrum (1.0-1.4 microns) that overlaps the atmospheric night glow irradiance. Numerical data in FIG. 8 for the night sky spectral irradiance corresponding to FIG. 7 was obtained from the Night Vision Laboratory for the GEN III image intensifer, and from EPV Corporation for the CIS photoconductor material. An overlay of the night sky spectral irradiance for starlight superimposed on FIG. 7 shows that the photo-response of a CIS/CMOS sensor provides a much better spectral match to the starlight spectrum than a GEN III image intensifier. Calculations from FIG. 7 and FIG. 8 show that the CIS/CdS image sensor potentially has 20 times more integrated photo-response to the night sky spectral irradiance than a GEN III image intensifier.

The more appropriate way to compare image sensors is to calculate the signal-noise-ratios of each sensor under appropriate operating conditions. FIG. 9 displays the operating assumptions for starlight imaging and the derived signal-to-noise characteristics. Applicants' CIS/CdS image sensor has approximately 8 times more signal-to-noise than the GEN III image intensifier, under these operating conditions.

For a preferred embodiment of the present invention, Applicants have designed, fabricated and tested a night vision sensor by replacing the existing indium gallium arsenide (InGaAs) bump bonded detector on a commercially available CMOS readout array (Indigo Systems 9809 array) with the CIS coating described above. This readout array was developed for use as a highly sensitive bump-bonded infrared focal plane array, by incorporating indium gallium arsenide (InGaAs) crystal as the photodetector. Top-level specifications include a 320×256 pixel array (80 kpixels), 30 micron pixels, and 70 electrons readout noise. Each pixel in the 9809 readout array features a full operational amplifier that maintains the photodiode node at a virtual ground. This feature is important for controlling the dark current of the photodiode coatings.

CMOS Stitching for Very Large Pixel Arrays

Applicants have developed techniques for combining its continuous layer photodiode CMOS sensor technology with CMOS integrated circuit lithography stitching techniques to design digital cameras with an almost unlimited number of pixels. For example, Applicants have produced designs for producing a 250 million pixel sensor on single wafer substrates using a single integrated circuit lithography mask. These techniques are described below:

CMOS Stitched Sensor Fabrication

CMOS stitching technique is a specialized CMOS foundry technique that enables wafer scale electrical circuits to be fabricated. A conventional CMOS process (0.35 micron process, for example) fabricates hundreds of identical electrical circuits, each smaller than the conventional 22 mm×22 mm photolithography mask size, by using a precise stepper photolithography device to sequentially expose a particular layer of each circuit in hundreds of precise circuit locations on the eight inch wafer. The stepper devices are capable of submicron revisit alignment accuracy, so different layers of the identical circuits are fabricated by exposing different photolithography masks (eighteen, for example), and then subjecting the wafers to conventional CMOS fabrication techniques. The CMOS stitching technique exploits the precise alignment accuracy of the CMOS stepper process by using a specialized mask set, displayed in FIG. 14A, that contains the different redundant building blocks of a very large electrical circuit. The design of the mask set for the proposed work is actually a design library featuring the baseline (A) and the advanced (B) pixel designs, and their complementary 10-bit (A) and 12-bit (B) post processing circuitries; these circuit blocks feature programmable gain, correlated double sampling, and analog-to-digital converters (slope converters) at the end of each column of the pixel array. The pixel blocks each comprise a 1024 (H)×1100 (V) pixel array and the post processing blocks each comprise a linear array of redundant post processing circuits, 1024 elements for the 10-bit design and 512 elements for the 12-bit design. The row selection function is controlled by the row addressing blocks and the timing and logic functions are controlled by the timing/logic blocks.

Figure 14B:
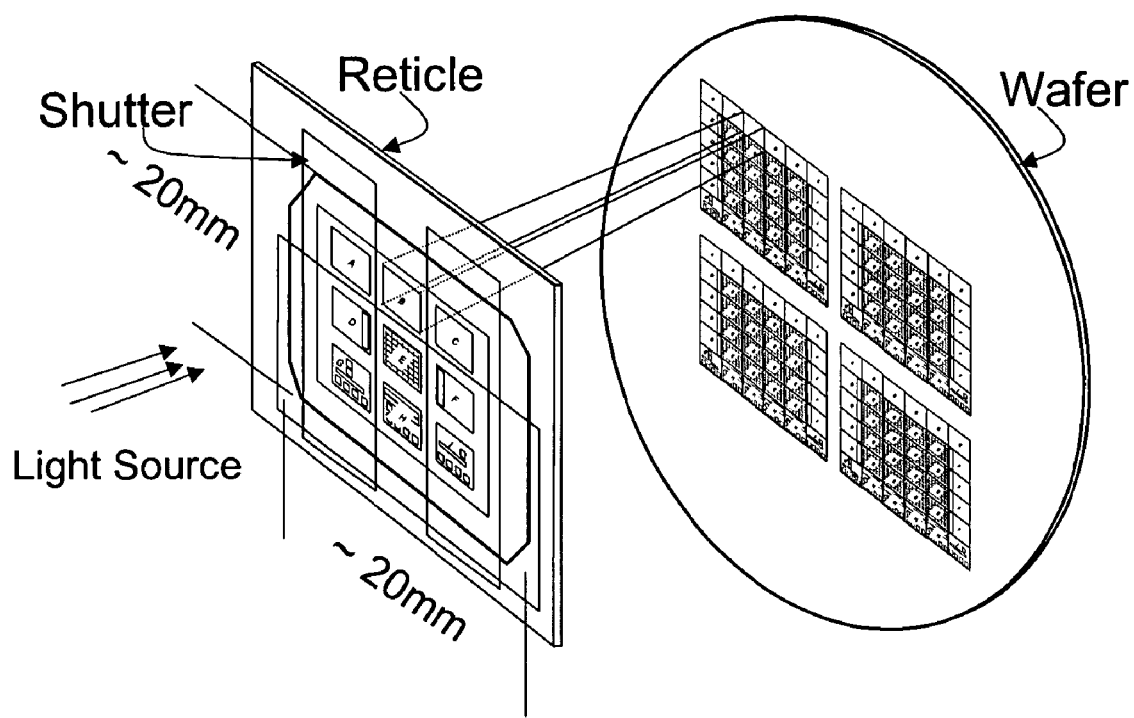
FIG. 14B shows the CMOS stitching technique.

The CMOS stitching mask set is fabricated and then utilized with a conventional CMOS 0.35 micron photolithography stepper system (0.1 micron alignment accuracy across entire wafer). The different blocks of each mask design are shuttered as shown in FIG. 14B so that only a single block is projected on the wafer at one time. Multiple sequential projections of different blocks, displayed in FIG. 14B, result in the fabrication of very large electrical circuits, up the size of the entire wafer. It should be noted that stitching creates a truly seamless circuit, as opposed to assembly of closely butted individual circuits. The underlying discrete transistors are fabricated using the initial masks and ion implantation techniques. The overlying polysilicon and metal electrical lines are then fabricated to be electrically contiguous over a very large electrical circuit.

Figure 14C:
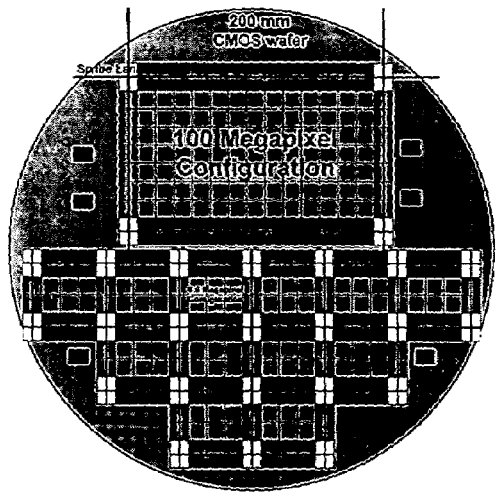
FIG. 14C shows a preferred wafer layout for fabricating different sized very large arrays using the CMOS stitching technique.

A preferred wafer layout for Applicants' development effort, displayed in FIG. 14C, features one 100 million pixel focal plane array circuit (13 thousand pixels×7 thousand pixels), twelve 6 million pixel FPA circuits (3 thousand pixels×2 thousand pixels) circuits, and several small test circuits. The relative locations of the different electrical building blocks can be seen in FIG. 14C. The 100 million pixel FPA features the baseline 10-bit pixel circuit (A), and six of the 6 million pixel circuits feature the advanced 12-bit pixel circuit (B).

FIG. 14C shows an exciting advantage of CMOS stitched technique is the ability to produce scalable or reconfigurable arrays. A single mask set can be used to fabricate different format FPAs, on the same, or different wafers. The present mask design can potentially provide a 250 million pixel (16 thousand pixels×16 thousand pixels) FPA just by re-specifying the mask exposure sequence to the stepper device.

Figure 14D:
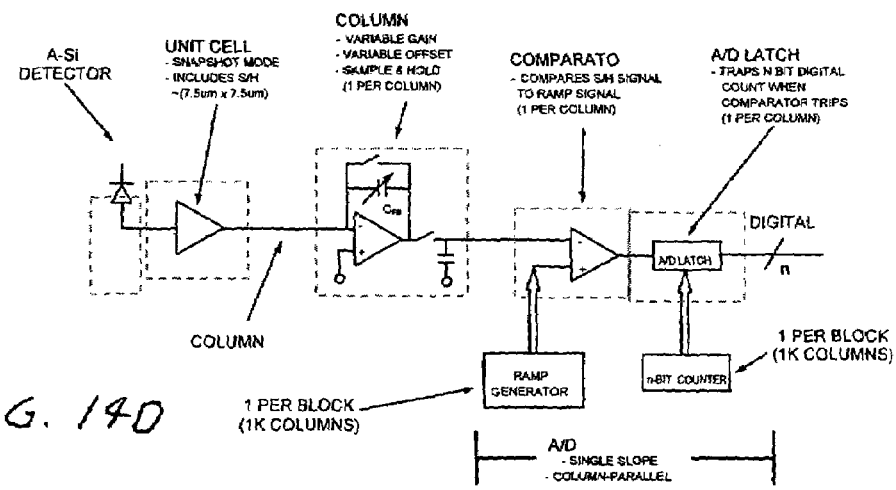
FIG. 14D shows the overall electronic architecture of each focal plane array.

The overall electronic architecture of each FPA, displayed in FIG. 14D, is an integrated CMOS architecture. The amplified output of the storage capacitor each pixel in a selected row is electrically connected to peripheral circuitry at the end of each column. The output voltage signal is amplified by a pre-selectable variable gain amplifier. Sample-and-hold circuitry is used to present the amplified signal to the analog-to-digital (A/D) converter. The A/D slope converter uses a linear ramp, derived from a 10-bit or 12-bit counter, as one input to a comparator. The sampled voltage is presented to the other input of the comparator. When the ramp voltage equals the sampled voltage, the comparator shuts off the counter; the count is the digitized voltage. A 1024-element (512-element) digital multiplexer then sequentially presents each column in a 1024-element (512-element) block to a 10-bit (12-bit) parallel digital output.

Large Area Satellite Tracking Telescope

Figure 15A:
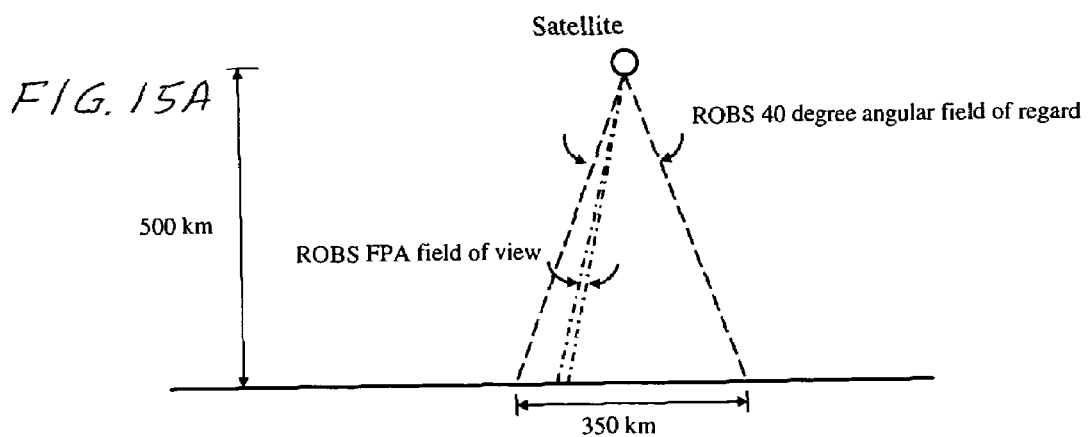
FIG. 15A-15B shows a low earth orbit (LEO) reconnaissance satellite that utilize the very large FPA and the ROBS optical tracking concept.
Figure 15B:
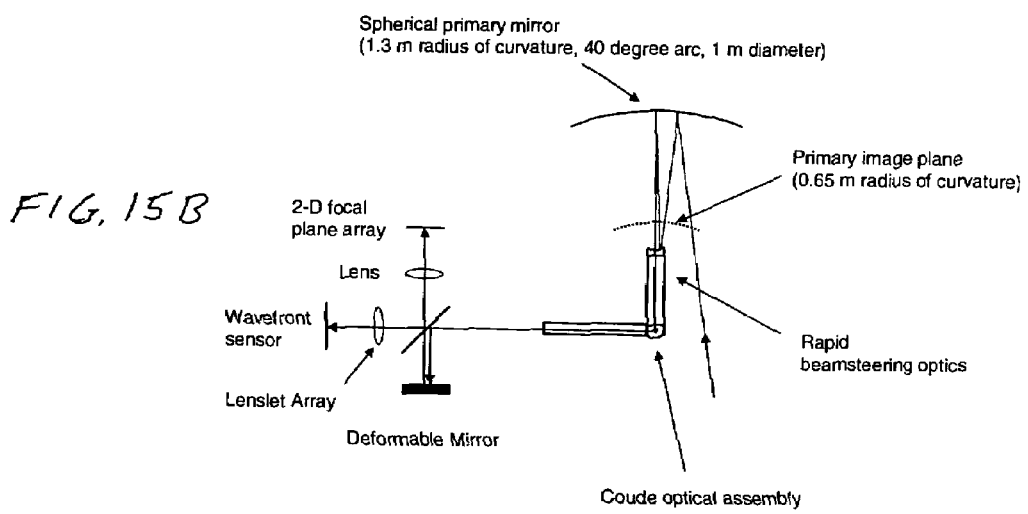
Figure 15C:
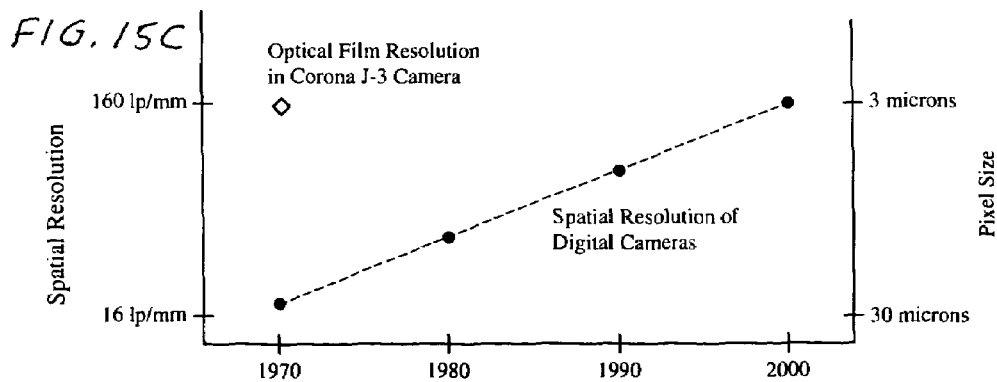
FIG. 15C shows the spatial resolution of digital sensors has decreased to mathc the spatial sampling capability of film over the last three decades.

FIGS. 15A-C show features of a large area satellite tracking telescope system that utilizes as a focal plane array sensors a very large pixel count sensor array. During the last 20 years, radar scattering techniques have been used to image objects from spacecraft. The use of synthetic aperture radar (SAR) has revolutionized imaging by offering radar images that can be obtained day and night and under all weather conditions. However, this technology has some basic physics limitations because radar scattering cannot be used to image humans or other potential targets that do not reflect at the selected frequency. Additionally, radar images tend to have much lower quality than optical images, due to the multiple scattering mechanisms used to obtain the reflected signal. Applicants propose a satellite tracking system that combines features of the rapid optical beam steering telescope described in U.S. Pat. No. 4,883,348 (called the ROBS telescope) with a large pixel count focal plane array according to the present invention.

Depicted in FIG. 15A is a low earth orbit (LEO) optical imaging spacecraft capable of providing precision tracking, high resolution video area coverage and selected zooming capabilities, for precise geo-location and moving target indication purposes. The proposed work introduces a significant new capability for space-based optical tracking by using a ROBS system. The central concept involves the coupling of the ROBS tracking/imaging capability with a very large (100 Mpixel or larger) focal plane array (FPA) to provide multiple-timeframe snapshot surveillance imaging of the earth over a fairly wide field of view, and video surveillance imaging over a smaller field of view. The system capability, displayed in Table 2, will combine a 40 degree field of regard (350 km ground coverage of regard for a 500 km orbital height) of the ROBS optical tracking system with the 1.5 km ground coverage of the very large FPA (0.3 m ground resolution). The ROBS optical system will have the capability to track a single 1.5 km ground area for a period of several minutes as the satellite passes overhead. The relative geo-location (i.e. position vector relationship between position A and position B) and tracking (i.e. velocity vector of target A or B) capabilities within this ground coverage will be potentially accurate to within the precision of the ground resolution. This system will enable a LEO satellite to operate, for several minute period as it passes overhead, in a similar capacity as a long dwell imaging satellite. In addition to this capability, the tracking system will enable surveillance of up to 20 separate ground areas within the entire angular field of regard during the several minutes that the satellite passes overhead. The ROBS revisit tracking accuracy will have a 10 micro-radian revisit precision. In addition, measurement of the relative relationship of moving and non-moving targets within the revisit ground coverage will potentially provide tracking resolution to within the precision of the ground resolution divided by the revisit time.

The design for the tracking surveillance system is shown in FIG. 15B and the below table. The 1-meter diameter of the spherical primary mirror defines the optical aperture. Incident light from the imaged object is focused onto the focal plane of the primary mirror which is one half (0.65 meter) of the 1.3 meter radius of curvature of the primary mirror. The primary image is reflected back to the primary mirror and then through the rapid beam-steering optics, and is focused onto a secondary image plane that is close to the pivot point of the ROBS system. The ROBS Coude optical assembly at the pivot point is the key optical element of the ROBS system that enables the rapid tracking function of the system. The Coude optical assembly steers the image from the secondary image plane to a third optical system that focuses the secondary image plane onto a two dimensional focal plane array located at the final image plane. The rapid beam steering optics assembly is rapidly positioned to any angle within a 40 degree angular field of regard by the use of four orthogonal Kevlar cords attached to a mechanical beam steering subsystem.

TABLE 2

| Item | Specification |
|---|---|
| Orbital Height | 500 km |
| Angular Field of Regard | 40 degrees |
| Primary Mirror | 45 degree arc of a spherical mirror |
| Radius of Curvature of Primary Mirror | 1.3 m |
| Focal Length of Primary Mirror | 0.65 m |
| Aperture | 1 m |
| FPA Pixel Count | 10k × 10k (100 Mpixel) |
| Pixel Pitch | 5 microns |
| Ground Resolution | 0.3 m |
| Ground Coverage | 1.5 km |
| Frame Rate | 30 Hz |
| Maximum Retargeting Rate | 15 sequential targets in 1 second |
| Ground Field of Regard | 350 km |
| Maximum Viewing Time for One Target | 100 seconds |

The ROBS optical design provides a novel approach to wide field of view beam-steering optical systems with optimal aberration correction. Conventional mirror telescope or lens based imaging systems typically use a planar beam steering mirror to scan around a fixed optical imaging axis, and then image onto an FPA. These systems typically have a very narrow (<1 degree) field of regard due the monotonically increasing off-axis optical aberrations that are inherent with a fixed optical axis. Other spaced-based reconnaissance satellites jerk the entire satellite (and the optical axis) to different angular positions to image within a wider angular field of view. In contrast, the spherical symmetry of the ROBS system enables the optical axis of the entire optical system to follow the line of sight of the lightweight ROBS beam steering optic which is always perpendicular to the primary mirror surface. Optical aberrations always minimize at the optical axis; therefore, the ROBS design enables a highly agile, highly precise optical beam steering system that can rapidly and precisely track multiple targets with very high resolution.

The surveillance system includes the very large FPA of the present invention where the pixel count is preferably greater than 100 million pixels. In addition to the ROBS tracking capability, different pixel areas of the very large FPA can be imaged at video rates for tracking purposes. Initial studies of the off-axis optical aberrations of the proposed system show that conventional ROBS design show significant degradation of the imaging capability at the periphery of the FPA. It may be desirable to design an adaptive optic design that provides high resolution over the entire FPA for all angular positions of the rapid beam steering optic. The adaptive optic will be calibrated to a look-up table the continuously updates the aberration corrections as the ROBS system steers over the angular field of regard.

While there have been shown what are presently considered to be preferred embodiments of the present invention, it will be apparent to those skilled in the art that various changes and modifications can be made herein without departing from the scope and spirit of the invention. For example, this camera can be used without a lens to monitor the light intensity profile and output the change of intensity and profile. This is crucial in optical communication application where beam profile needs to be monitored for highest transmission efficiency. Thus, the scope of the invention is to be determined by the appended claims and their legal equivalents.

We claim:

1. A MOS or CMOS based visible/near infrared sensor array comprising:
   A) a substrate,
   B) a plurality of MOS or CMOS pixel circuits fabricated in or on said substrate, each pixel circuit comprising:
      1) a charge collecting electrode for collecting electrical charges and
      2) a plurality of transistors for monitoring periodically charges collected by said charge collecting electrode,
   C) a continuous un-pixelated photodiode layer of charge generating material located above said pixel circuits for converting into electrical charges electromagnetic radiation in the visible and near infrared spectral ranges, said photodiode layer comprising at least an n-layer, an intrinsic layer and a p-layer,
   wherein each of the n-layer, the intrinsic layer and the p-layer of the continuous un-pixelated photodiode layer are continuous with no gaps between pixels, and
   wherein one of said n-layer or said p-layer is adjacent to the charge collecting electrodes in each of the pixel circuits to define a bottom layer; and
   wherein the bottom layer comprises sufficient carbon to increase its electrical resistance to more than $2 \times 10^7$ ohm-cm to minimize pixel-to-pixel crosstalk; and
   D) a surface electrode in the form of a grid or thin transparent layer located above said layer of charge generating material.

2. The sensor as in claim 1 wherein said charge generating material also converts electromagnetic radiation in ultraviolet spectral ranges into electrical charges.

3. The sensor as in claim 2 wherein said surface electrode is comprised of indium tin and oxygen.

4. The sensor as in claim 2 wherein said plurality of pixel circuits in at least 2 million CMOS pixel circuits.

5. The sensor as in claim 1 wherein one of the said intrinsic layer comprises microcrystalline silicon.

6. The sensor as in claim 5 wherein said microcrystalline layer is grown using a radio frequency plasma enhanced chemical vapor deposition process.

7. The sensor as in claim 1 wherein the said intrinsic layer is comprised entirely of microcrystalline silicon.

8. The sensor as in claim 1 wherein said p-layer is comprised of copper selenium and indium and said n-layer is comprised of cadmium and sulfur.

9. The sensor as in claim 8 wherein said p-layer also comprises gadolinium.

10. The sensor as in claim 9 wherein said n-layer is on top of said p-layer.

11. The sensor as in claim 10 wherein said p-layer is deposited from a four crucible vapor.

12. The sensor as in claim 1 wherein said photodiode layer comprises geranium.

13. The sensor as in claim 1 wherein said photodiode layer comprises microcrystalline germanium.

14. The sensor as in claim 1 wherein said surface electrode is comprised of indium tin and oxygen.

15. The sensor as in claim 1 wherein said p-layer is located adjacent to said surface electrode.

16. The sensor as in claim 1 wherein said plurality of pixel circuits in at least 2 million CMOS pixel circuits.

17. The sensor as in claim 1 wherein said plurality of pixel circuits in at least 100 million CMOS pixel circuits.

18. The sensor as in claim 1 wherein said pixel circuits are located on a single wafer and are comprised of pixels produced in die spots that are lithographically stitched together to form a unitary pixel array of more than 50 million pixels.

19. The sensor as in claim 18 wherein said array of more than 50 million pixels is an array of more than 100 million pixels.

20. An array as in claim 1 and also comprising data analyzing circuits fabricated on said substrate.

21. An array as in claim 1 wherein said sensor is configured with a Column-Parallel Analog-to Digital architecture.

22. An array as in claim 1 where said array is a component of a video camera and said array further comprises two 10-bit output ports representing video output from columns and odd columns respectively.

23. An array as in claim 1 wherein said surface electrode is comprised of a layer of indium tin oxide.

24. An array as in claim 1 and further comprising an array of color filters located on top of said surface electrode.

25. An array as in claim 24 wherein said color filters are comprised of red, green and blue filters arranged in four color quadrants of two green, one red and one blue.

26. An array as in claim 1 wherein said array is a part of a camera incorporated into a device chosen from the following group: Analog camcorder Digital camcorder Security camera Digital still camera Personal computer camera Toy Military unmanned aircraft, bomb and missile Sports equipment High definition television camera Telescope ROBS Telescope.

* * * * *